US012591178B2

(12) United States Patent
Khedekar et al.

(10) Patent No.: US 12,591,178 B2
(45) Date of Patent: Mar. 31, 2026

(54) METHOD FOR ADJUSTING A PATTERNING PROCESS

(71) Applicant: ASML NETHERLANDS B.V., Veldhoven (NL)

(72) Inventors: Satej Subhash Khedekar, Veldhoven (NL); Henricus Jozef Castelijns, Hapert (NL); Anjan Prasad Gantapara, Veldhoven (NL); Stephen Henry Bond, Eijsden (NL); Seyed Iman Mossavat, Waalre (NL); Alexander Ypma, Veldhoven (NL); Gerald Dicker, Sint-Oedenrode (NL); Ewout Klaas Steinmeier, Waalre (NL); Chaoqun Guo, Shenzhen (CN); Chenxi Lin, Newark, CA (US); Hongwei Chen, Shenzhen (CN); Zhaoze Li, Shenzhen (CN); Youping Zhang, Cupertino, CA (US); Yi Zou, Foster City, CA (US); Koos Van Berkel, Waalre (NL); Joost Johan Bolder, Waalre (NL); Arnaud Hubaux, Erpent (NL); Andriy Vasyliovich Hlod, Eindhoven (NL); Juan Manuel Gonzalez Huesca, Eindhoven (NL); Frans Bernard Aarden, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 605 days.

(21) Appl. No.: 18/012,222

(22) PCT Filed: Jun. 14, 2021

(86) PCT No.: PCT/EP2021/065947
§ 371 (c)(1),
(2) Date: Dec. 21, 2022

(87) PCT Pub. No.: WO2022/008174
PCT Pub. Date: Jan. 13, 2022

(65) Prior Publication Data
US 2023/0273529 A1 Aug. 31, 2023

(30) Foreign Application Priority Data
Jul. 20, 2020 (EP) ..................................... 20186710
May 10, 2021 (EP) ..................................... 21172961

(51) Int. Cl.
G03F 7/00 (2006.01)
G06N 3/02 (2006.01)

(52) U.S. Cl.
CPC ...... *G03F 7/70525* (2013.01); *G03F 7/70633* (2013.01); *G03F 7/7065* (2013.01)

(58) Field of Classification Search
CPC ............. G03F 7/70525; G03F 7/70633; G03F 7/7065; G03F 7/705; G03F 7/70508;
(Continued)

(56) References Cited

U.S. PATENT DOCUMENTS 6,952,253 B2    10/2005  Lof et al.
9,140,998 B2 *   9/2015  Smilde ................ G03F 7/70483
(Continued)

FOREIGN PATENT DOCUMENTS

EP          1628164       2/2006
JP       2017536584      12/2017
(Continued)

OTHER PUBLICATIONS

International Search Report and Written Opinion issued in the corresponding International Application No. PCT/EP2021/065947 (Sep. 17, 2021).
(Continued)

*Primary Examiner* — Nghia M Doan
(74) *Attorney, Agent, or Firm* — Pillsbury Winthrop Shaw Pittman, LLP

(57) ABSTRACT
Generating a control output for a patterning process is described. A control input is received. The control input is
(Continued)

for controlling the patterning process. The control input includes one or more parameters used in the patterning process. The control output is generated with a trained machine learning model based on the control input. The machine learning model is trained with training data generated from simulation of the patterning process and/or actual process data. The training data includes 1) a plurality of training control inputs corresponding to a plurality of operational conditions of the patterning process, where the plurality of operational conditions of the patterning process are associated with operational condition specific behavior of the patterning process over time, and 2) training control outputs generated using a physical model based on the training control inputs.

20 Claims, 12 Drawing Sheets

(58) Field of Classification Search
CPC ......... G03F 7/706837; G03F 7/706841; G03F 7/70875; G06N 3/02
See application file for complete search history.

(56) References Cited

U.S. PATENT DOCUMENTS

| | | | |
|---|---|---|---|
| 10,417,359 B2 * | 9/2019 | Socha | G03F 7/70625 |
| 10,990,018 B2 | 4/2021 | Tel et al. | |
| 2008/0212097 A1 * | 9/2008 | Mos | G03F 7/70633 356/400 |
| 2010/0328655 A1 | 12/2010 | Den Boef | |
| 2011/0026032 A1 | 2/2011 | Den Boef et al. | |
| 2011/0102753 A1 | 5/2011 | Van De Kerkhof et al. | |
| 2011/0249244 A1 | 10/2011 | Leewis et al. | |
| 2012/0044470 A1 | 2/2012 | Smilde et al. | |
| 2016/0170311 A1 * | 6/2016 | Schmitt-Weaver | G03F 7/70516 355/67 |
| 2022/0011728 A1 | 1/2022 | Zhang et al. | |

FOREIGN PATENT DOCUMENTS

| | | |
|---|---|---|
| JP | 2019502950 | 1/2019 |
| JP | 2019165123 | 9/2019 |
| JP | 2020509431 | 3/2020 |
| WO | 2020/099022 | 5/2020 |
| WO | 2020099011 | 5/2020 |
| WO | 2020/114686 | 6/2020 |

OTHER PUBLICATIONS

Jihyun Kim et al., "Neural Networks Fusion to Overlay Control System for Lithography Process", AI 2006, Lecture Notes in Artificial Intelligence 4304, pp. 587-596 (2006).

Office Action issued in corresponding Japanese Patent Application No. 2022-580736, dated Jan. 16, 2024.

Office Action issued in corresponding Chinese Patent Application No. 202180048684.0, dated Dec. 17, 2025.

* cited by examiner

1300

$$LHFF_{pred}(Z_{n\_m}) = f(\mu_1, \mu_2, T_1, T_2,)$$

1302

1304

1306

$$Cost_{total}(Z_{n\_m}) = Cost_{mu\_tau}(Z_{n\_m}) + w * \boxed{Cost_{LHFF}(Z_{n\_m})}$$

1308

METHOD FOR ADJUSTING A PATTERNING PROCESS

CROSS-REFERENCE TO RELATED APPLICATIONS

This application is the U.S. national phase entry of PCT patent application no. PCT/EP2021/065947 which was filed on Jun. 14, 2021, which claims priority of PCT patent application no. PCT/CN2020/101030 which was filed on Jul. 9, 2020, of European patent application no. 20186710.8 which was filed on Jul. 20, 2020 and of European patent application no. 21172961.1 which was filed on May 10, 2021, which are incorporated herein in their entireties by reference.

FIELD

The present disclosure relates to systems, products, and methods for adjusting a patterning process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced, while the amount of functional elements, such as transistors, per device has been steadily increasing over decades, following a trend commonly referred to as 'Moore's law'. To keep up with Moore's law the semiconductor industry is chasing technologies that enable it to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm, and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such a process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance.

To overcome these difficulties, sophisticated fine-tuning steps may be applied to the lithographic projection apparatus and/or design layout. These include, for example, but are not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low-$k_1$.

In lithographic processes, it is desirable to make frequent measurements of the structures created, e.g., for process control and verification. Tools to make such measurement are typically called metrology tools or inspection tools. Different types of metrology tools for making such measurements are known, including scanning electron microscopes or various forms of scatterometer metrology tools. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US2010/0328655, US2011/102753A1, US2012/0044470A, US2011/0249244, US2011/0026032 or EP1,628,164A, incorporated herein by reference in their entirety. Aforementioned scatterometers may measure gratings using light from soft x-ray and visible to near-IR wavelength range.

SUMMARY

A physical model may be used to model one or more components of an apparatus, a process and/or series of processes, and/or perform other modelling. Physical modelling can be computationally expensive, and often requires adjustment when a given apparatus, component, and/or set of process conditions changes. Such change may include changes in the motion of one or more components of an apparatus, changing disturbance forces, different component heating, and/or other patterning process conditions that change over time. Physical modelling often requires a trade-off between accuracy of the physical model and computational expense.

As such, it is an object of the present invention to provide systems and methods configured to more accurately model motion, disturbance forces, heating, and/or other patterning process conditions that change over time.

In contrast to prior systems, the present systems and methods are configured for generating a control output for a patterning process with a trained machine learning model. The machine learning model is trained with training data comprising a plurality of training control inputs corresponding to a plurality of operational conditions of the patterning process. The plurality of operational conditions of the patterning process are associated with operational condition specific behavior of the patterning process over time (e.g., changes in the patterning process such as drift, etc., over time).

Among other advantages, this enhances the accuracy of the model, specifically regarding motion, disturbance forces, heating, and/or other patterning process conditions that change over time. In semiconductor manufacturing, this may result in enhanced device dimension accuracy, higher yield, reduced process set up time, faster throughput, more accurate overlay and/or other process control measurements, and/or have other effects.

Considering at least the above, according to an embodiment of the invention, there is provided a non-transitory computer readable medium having instructions thereon. The instructions when executed by a computer cause the computer to receive a control input. The control input is for controlling a patterning process. The control input comprises one or more parameters used in the patterning process. The instructions cause the computer to generate, with a trained machine learning model, based on the control input, a control output for the patterning process. The machine learning model is trained with training data generated from simulation of the patterning process and/or actual process data. The training data comprises 1) a plurality of training control inputs corresponding to a plurality of operational conditions of the patterning process. The plurality of operational conditions of the patterning process are associated with operational condition specific behavior of the patterning process over time. The training data comprises 2) training control outputs generated using a physical model based on the training control inputs and/or the plurality of operational conditions of the patterning process.

In an embodiment the control output comprises an adjustment of the one or more parameters.

In an embodiment, the operational condition specific behavior of the patterning process over time comprises drift in the patterning process over time.

In an embodiment, the machine learning model is further configured to be updated over time by re-training the machine learning model with new actual process data from the patterning process.

In an embodiment, the re-training comprises fine tuning.

In an embodiment, the control input is associated with monitoring and/or diagnosing the patterning process.

In an embodiment, the machine learning model comprises a parameterized model.

In an embodiment, the machine learning model comprises an artificial neural network, a convolutional neural network, and/or a recurrent neural network.

In an embodiment, the patterning process is performed with a patterning process apparatus. The apparatus comprises a semiconductor lithography apparatus, an optical metrology inspection tool, or an e-beam inspection tool. The instructions further cause the computer to control the patterning process apparatus based at least in part on the control output.

In an embodiment, the one or more parameters comprise one or more lithography apparatus, optical metrology inspection tool, and/or e-beam inspection tool parameters, and/or associated lithography and/or inspection process parameters.

In an embodiment, the control input comprises the one or more parameters used in the patterning process.

In an embodiment, the control input comprises a diffraction pattern image, a motion setpoint, or a load sequence for a wafer and/or a reticle.

In an embodiment, the control output comprises an adjustment of one or more parameters associated with motion control of one or more components of a patterning process apparatus.

In an embodiment, motion control of one or more components of the patterning process apparatus comprises controlling actuation of a scanner via one or both of 1) controlling movement of a wafer and/or reticle stage of the scanner, 2) controlling flex-wave heating elements in a lens of the scanner, and/or 3) controlling one or more mirrors of the scanner. Example of mirrors are mirrors used in (flexibly) defining a pupil shape and/or field distortion profile.

In an embodiment, the control output comprises an adjustment of one or more parameters associated with thermal expansion of the one or more components of a patterning process apparatus.

In an embodiment, the control output comprises a wafer heating control adjustment, a reticle heating control adjustment, and/or a mirror heating control adjustment.

In an embodiment, determining the control output comprises predicting an overlay fingerprint and/or a focus fingerprint, and determining the wafer heating control adjustment based on the predicted overlay fingerprint and/or focus fingerprint.

In an embodiment, determining the control output comprises predicting the overlay fingerprint, and determining the wafer heating control adjustment is based on the predicted overlay fingerprint.

In an embodiment, the control output comprises a lens heating control adjustment.

In an embodiment, determining the control output comprises: predicting mu tau parameter values associated with lens heating, a lens heating feedforward time sequence, and/or a lens heating field time sequence; determining a lens heating cost function based on the mu tau values, lens heating feedforward values, and/or lens heating field values; determining machine learning model parameter weights based on the lens heating cost function; and determining the lens heating control adjustment based on a lens heating prediction by the machine learning model.

In an embodiment, determining the control output comprises predicting an overlay fingerprint, a focus fingerprint, and/or an imaging fingerprint, and determining the lens heating control adjustment based on the predicted overlay fingerprint, focus fingerprint, and/or imaging fingerprint.

In an embodiment, the control output comprises an adjustment of one or more parameters associated with tribological-mechanical control of one or more components of a patterning process apparatus.

In an embodiment, determining the control output comprises predicting an overlay fingerprint and/or a focus fingerprint, and determining wafer, reticle, lens/mirror adjustments based on the predicted overlay fingerprint and/or focus fingerprint.

In an embodiment, training the machine learning model with simulated and/or actual process training data from the patterning process comprises an initial calibration, wherein the machine learning model is configured to be updated over time by re-training the machine learning model with new actual process data from the patterning process, and wherein the re-training comprises configuring the machine learning model to be fine-tuned with one or more drift calibrations configured to account for drift that occurs in the patterning process over time.

In an embodiment, training and/or updating is performed off-line, online, or off-line and online in combination.

In an embodiment, simulated training data comprises a plurality of benchmark training control input and corresponding training control output pairs generated using the physical model. The machine learning model is configured to predict, based on a training control input, a predicted control output. The machine learning model is configured to use a training control output as feedback to update one or more configurations of the machine learning model. The one or more configurations are updated based on a comparison between the training control output and the predicted control output.

In an embodiment, the instructions are further configured to cause the computer to configure the machine learning model to be updated over time by fine-tuning the machine learning model with new actual process data from the patterning process, such that the machine learning model is configured for: receiving local actual process data associated with a production environment local patterning process with the machine learning model to determine first updated model parameter values; receiving second updated model parameter values obtained by providing the machine learning model at least partially with external training data, the external training data indicative of patterning process apparatus to apparatus variation; and adjusting the machine learning model by updating initial model parameter values with the first and/or second updated model parameter values.

In an embodiment, the adjusting accounts for drift in the local patterning process over time.

According to another embodiment, there is provided a method for generating a control output for a patterning process. The method comprises receiving a control input. The control input is for controlling a patterning process. The control input comprises one or more parameters used in the patterning process. The method comprises generating, with a trained machine learning model, based on the control input, a control output for the patterning process. The control output comprises an adjustment of the one or more parameters. The machine learning model is trained with training data generated from simulation of the patterning process and/or actual process data. The training data comprises 1) a plurality of training control inputs corresponding to a plurality of operational conditions of the patterning process. The plurality of operational conditions of the patterning process are associated with operational condition specific behavior of the patterning process over time. The training data comprises 2) training control outputs generated using a physical model based on the training control inputs and/or the plurality of operational conditions of the patterning process.

In an embodiment, the operational condition specific behavior of the patterning process over time comprises drift in the patterning process over time.

In an embodiment, the method further comprises updating the machine learning model over time by re-training the machine learning model with new actual process data from the patterning process.

In an embodiment, the re-training comprises fine tuning.

In an embodiment, the control input is associated with monitoring and/or diagnosing the patterning process.

In an embodiment, the machine learning model comprises a parameterized model.

In an embodiment, the machine learning model comprises an artificial neural network, a convolutional neural network, and/or a recurrent neural network.

In an embodiment, the patterning process is performed with a patterning process apparatus. The apparatus comprises a semiconductor lithography apparatus, an optical metrology inspection tool, or an e-beam inspection tool. The method further comprises controlling the patterning process apparatus based at least in part on the control output.

In an embodiment, the one or more parameters comprise one or more lithography apparatus, optical metrology inspection tool, and/or e-beam inspection tool parameters, and/or associated lithography and/or inspection process parameters.

In an embodiment, the control input comprises the one or more parameters used in the patterning process.

In an embodiment, the control input comprises a diffraction pattern image, a motion setpoint, or a load sequence for a wafer and/or a reticle.

In an embodiment, control output comprises an adjustment of one or more parameters associated with motion control of one or more components of a patterning process apparatus.

In an embodiment, motion control of one or more components of the patterning process apparatus comprises controlling actuation of a scanner via one or both of 1) controlling movement of a wafer and/or reticle stage of the scanner, 2) controlling flex-wave heating elements in a lens of the scanner, and/or 3) controlling one or more mirrors of the scanner.

In an embodiment, the control output comprises an adjustment of one or more parameters associated with thermal expansion of the one or more components of a patterning process apparatus.

In an embodiment, the control output comprises a wafer heating control adjustment, a reticle heating control adjustment, and/or a mirror heating control adjustment.

In an embodiment, determining the control output comprises predicting an overlay fingerprint and/or a focus fingerprint, and determining the wafer heating control adjustment based on the predicted overlay fingerprint and/or focus fingerprint.

In an embodiment, determining the control output comprises predicting the overlay fingerprint, and determining the wafer heating control adjustment is based on the predicted overlay fingerprint.

In an embodiment, the control output comprises a lens heating control adjustment.

In an embodiment, determining the control output comprises: predicting mu tau parameter values associated with lens heating, a lens heating feedforward time sequence, and/or a lens heating field time sequence; determining a lens heating cost function based on the mu tau values, lens heating feedforward values, and/or lens heating field values; determining machine learning model parameter weights based on the lens heating cost function; and determining the lens heating control adjustment based on a lens heating prediction by the machine learning model.

In an embodiment, determining the control output comprises predicting an overlay fingerprint, a focus fingerprint, and/or an imaging fingerprint, and determining the lens heating control adjustment based on the predicted overlay fingerprint, focus fingerprint, and/or imaging fingerprint.

In an embodiment, the control output comprises an adjustment of one or more parameters associated with tribological-mechanical control of one or more components of a patterning process apparatus.

In an embodiment, determining the control output comprises predicting an overlay fingerprint and/or a focus fingerprint, and determining wafer, reticle, lens/mirror adjustments based on the predicted overlay fingerprint and/or focus fingerprint.

In an embodiment, training the machine learning model with simulated and/or actual process training data from the patterning process comprises an initial calibration, wherein the machine learning model is configured to be updated over time by re-training the machine learning model with new actual process data from the patterning process, and wherein the re-training comprises configuring the machine learning model to be fine-tuned with one or more drift calibrations configured to account for drift that occurs in the patterning process over time.

In an embodiment, training and/or updating is performed off-line, online, or off-line and online in combination.

In an embodiment, simulated training data comprises a plurality of benchmark training control input and corresponding training control output pairs generated using the physical model. The machine learning model is configured to predict, based on a training control input, a predicted control output. The machine learning model is configured to use a training control output as feedback to update one or more configurations of the machine learning model, where the one or more configurations are updated based on a comparison between the training control output and the predicted control output.

In an embodiment, the method further comprises configuring the machine learning model to be updated over time by fine-tuning the machine learning model with new actual process data from the patterning process, such that the machine learning model is configured for: receiving local actual process data associated with a production environment local patterning process with the machine learning model to determine first updated model parameter values; receiving second updated model parameter values obtained by providing the machine learning model at least partially with external training data, the external training data indicative of patterning process apparatus to apparatus variation; and adjusting the machine learning model by updating initial model parameter values with the first and/or second updated model parameter values.

In an embodiment, the adjusting accounts for drift in the local patterning process over time.

According to another embodiment, there is provided a method for training a machine learning model. The method comprises generating training data by simulating a patterning process. The training data comprises a plurality of training control inputs and corresponding training control outputs. The training control inputs comprise one or more parameters used in the patterning process and the training control outputs comprise adjustments of the one or more parameters. The method comprises providing the training control inputs to a base machine learning model to generate predicted control outputs; and using the training control outputs as feedback to update one or more configurations of the base machine learning model. The one or more configurations are updated based on a comparison between the training control outputs and the predicted control outputs, such that the machine learning model is configured to generate new control outputs based on new control inputs.

In an embodiment, the machine learning model is configured to be updated over time by re-training the machine learning model with actual and/or simulated process data from the patterning process.

In an embodiment, the patterning process is simulated with a physical model.

In an embodiment, the machine learning model is an artificial neural network.

According to another embodiment, there is provided a non-transitory computer readable medium having instructions thereon. The instructions when executed by a computer cause the computer to: receive a plurality of control inputs for controlling a patterning process for a plurality of corresponding operational conditions, each of the control inputs comprising one or more parameters used in the patterning process; generate or receive a plurality of control outputs associated with one or more adjustments of the one or more parameters, the plurality of control outputs based on the output of a physical model used in simulating behavior of the patterning process subject to the plurality of operational conditions; and train a machine learning model configured to infer a new control output corresponding to a new control input by inputting the received plurality of control inputs and plurality of generated or received control outputs.

8

BRIEF DESCRIPTION OF THE DRAWINGS

Embodiments of the invention will now be described, by way of example only, with reference to the accompanying schematic drawings, in which.

DETAILED DESCRIPTION

Figure 1:
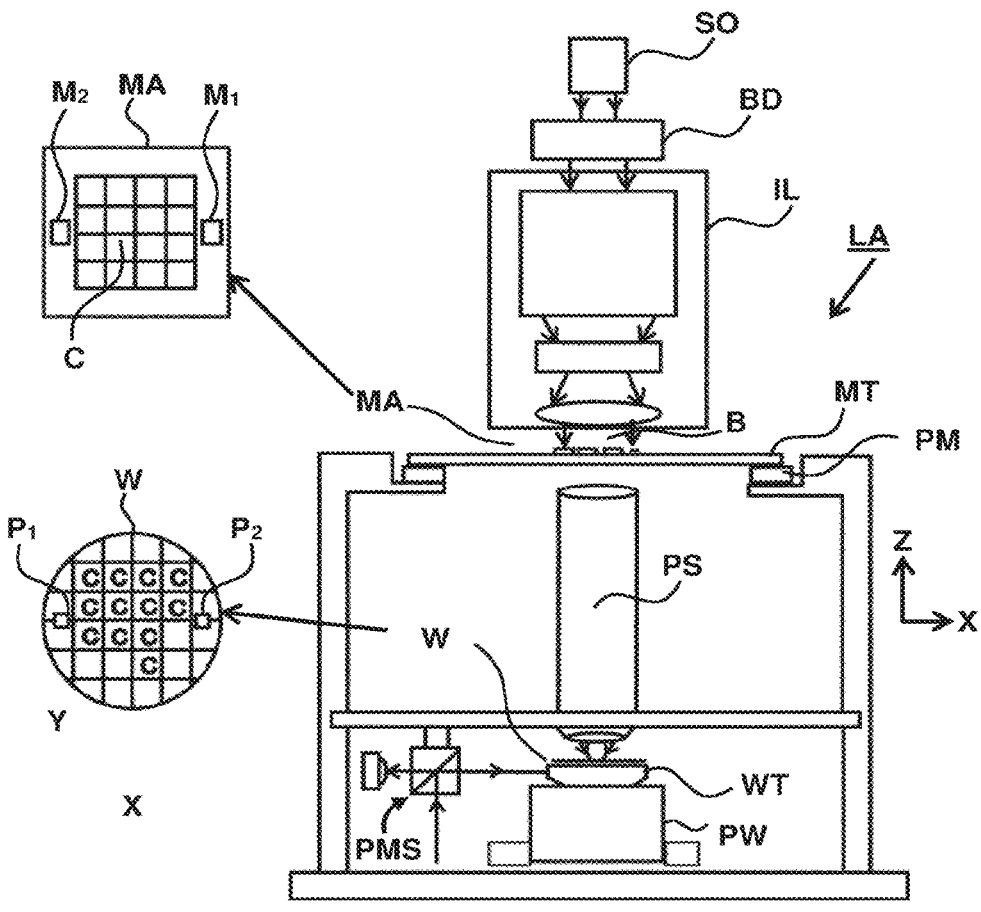
FIG. 1 depicts a schematic overview of a lithographic apparatus, according to an embodiment.

Feedforward control signals are used when controlling one or more components of an apparatus. Such signals are used in many control systems for components including wafer stages, reticle movement components, lenses, mirrors, and/or other components. Accurate feedforward control signals often depend on modelling of motion setpoints, disturbance forces, component heating, and/or other factors. Component heating may be caused by radiation that contacts, passes through, and/or passes near a given component, and/or have other causes. Disturbance forces may be forces that result from the movement of various components of an apparatus, the types of components used in an apparatus, the location of an apparatus, component wear, and/or other similar factors. For example, disturbance forces may be related to motor commutation, a cable slab, system drift, etc.

A motion setpoint may describe prescribed motion of a component of an apparatus. The setpoint may prescribe a position, velocity, acceleration, and/or other parameters (e.g., higher order time derivatives of such parameters, etc.) of the motion of the component over time.

In semiconductor manufacturing patterning processes and/or in other applications, component heating, motion setpoints, and disturbance forces often change over time. For example, components may not heat and/or cool in the same way day after day for process after process. Setpoints may be varied for several reasons such as supporting different field sizes; real-time or near real-time changes for overlay corrections to correct for wafer heating, reticle heating, and/or mirror/lens heating; and/or for other reasons. Disturbance forces may change from apparatus to apparatus, and/or may change based on the types of components used in an apparatus, the location of an apparatus, component wear, and/or other similar factors.

In practice, a physical model may be used to model one or more components of an apparatus, a process and/or series of processes, and/or perform other modelling. A physical model is based on a simulation that solves physical equations. In some embodiments, a physical model can be and/or include one or more physics based equations, a FEM, a dynamic lens heating analyzer, and/or other physical models. A physical model may be used to generate a control signal for a given apparatus, apparatus components, and/or process conditions, for example. However, such modelling is computationally expensive, and often requires adjustment when a given apparatus, component, and/or set of process conditions changes. As described above, these things change over time. Unfortunately, the number of possible process conditions, each having its own corresponding component heating, setpoint, disturbance force, and/or other variations over time is too large to calibrate a physical model for each variation individually (e.g., is so computationally expensive that it is prohibitive). Modeling a reasonable amount of individual variations (e.g. conditions) while still being achievable from computational expense point of view requires a tradeoff between accuracy of the physical model and computational expense.

In contrast to prior systems, the present systems and methods are configured for receiving a control input for controlling a patterning process. A control output for the patterning process is generated, with a trained machine learning model, based on the control input. The machine learning model is trained with training data generated from simulation of the patterning process and/or actual process data. The training data comprises a plurality of training control inputs corresponding to a plurality of operational conditions of the patterning process. The plurality of operational conditions of the patterning process are typically settings of one or more tools used in the patterning process which to at least some extend determine the behaviour of the patterning process over time, for example how drift and heating effects manifest themselves over time. The training data also comprises training control outputs generated using a physical model based on the training control inputs and/or the plurality of operational conditions of the patterning process.

Among other advantages, this enhances the accuracy of the modelling, specifically with regard to setpoints, disturbance forces, component heating, and/or other patterning process conditions that change over time. The accuracy enhancement is related to the possibility for/ability to calibrate to a very large number of process conditions. In semiconductor manufacturing, this may result in enhanced device dimension accuracy, higher yield, reduced process set up time, faster throughput, more accurate overlay and/or other process control measurements, and/or have other effects.

By way of a brief introduction, in the present document, generation of a control output is described in the context of integrated circuit and/or semiconductor manufacturing. This is not intended to be limiting. One of ordinary skill in the art may apply the principles described herein in other contexts.

Given the present context, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axis is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
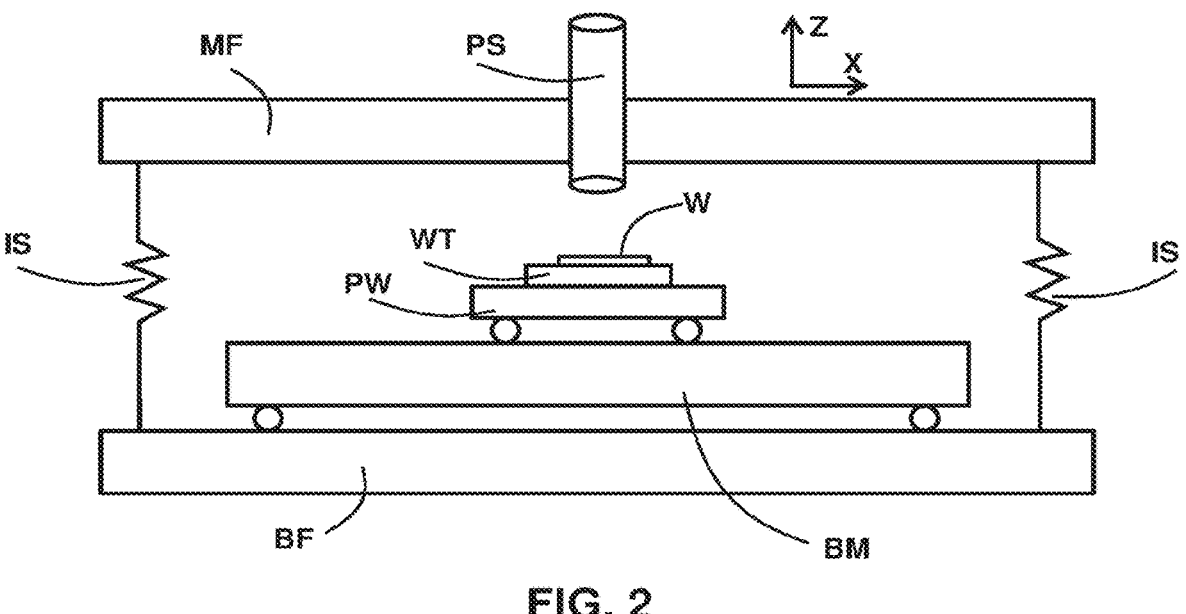
FIG. 2 depicts a detailed view of a part of the lithographic apparatus of FIG. 1, according to an embodiment.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

Figure 3:
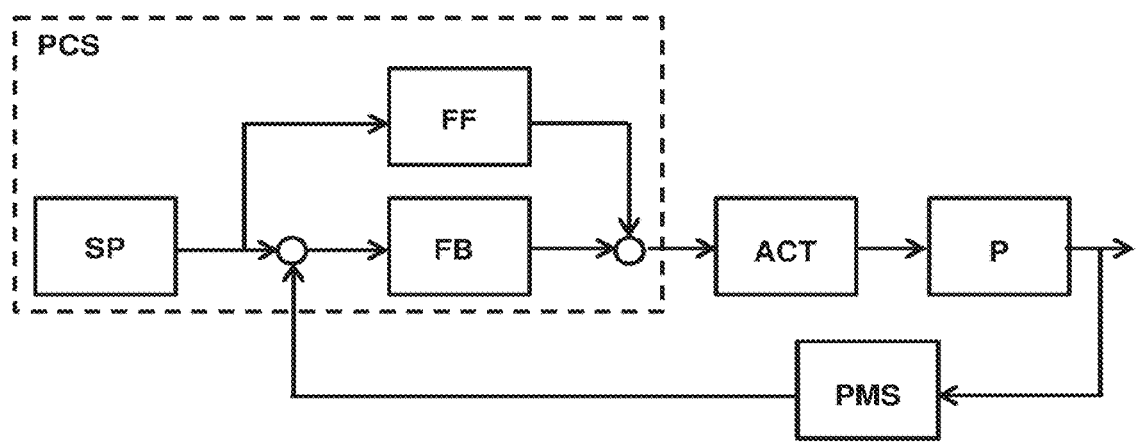
FIG. 3 schematically depicts a control system, according to an embodiment.

The lithographic apparatus LA may comprise a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW, and/or other moving components of the lithographic apparatus LA. For example, the actuator ACT may drive the plant P, which may comprise the substrate support WT or the mask support MT. An output of the plant P is a position quantity such as position or velocity or acceleration or another higher order time derivative of the position. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies. Additional details of the system shown in FIG. 3 are described below.

Figure 4:
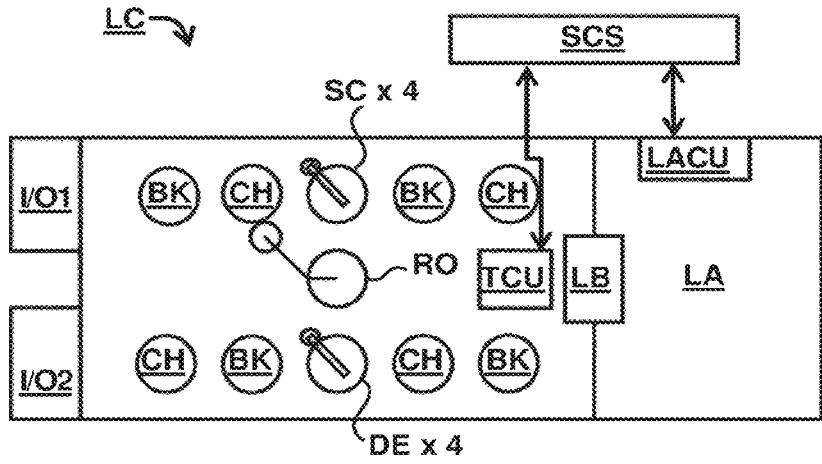
FIG. 4 schematically depicts a schematic overview of a lithographic cell, according to an embodiment.

As shown in FIG. 4 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 5:
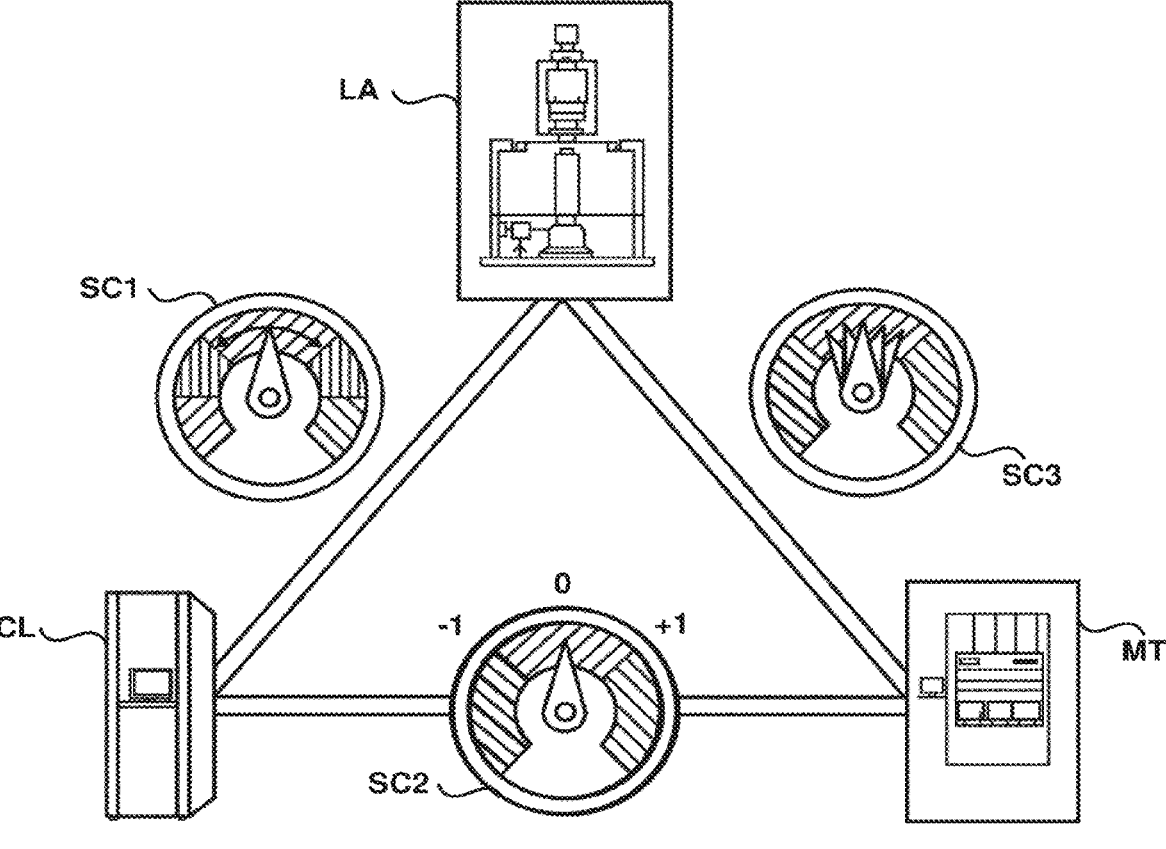
FIG. 5 is a schematic representation of holistic lithography, representing a cooperation between three key technologies to optimize semiconductor manufacturing, according to an embodiment.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 5. One of these systems is the lithographic apparatus LA which is (virtually) connected to a metrology tool MT (a second system) and to a computer system CL (a third system). The key of such a "holistic" environment is to optimize the cooperation between these three systems to enhance the overall process window and to provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 5 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 5 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

As mentioned above by reference to the FIGS. 1-5, the lithographic apparatus, the metrology tool and/or lithocell typically include a plurality of stage systems used to position a specimen, substrate, mask or sensor arrangement relative to a reference or another component. Examples thereof are the mask support MT and first positioner PM, the substrate support WT and the second positioner PW, the measurement stage arranged to hold a sensor and/or a cleaning device, and the stage used in the inspection tool MT where a substrate W is positioned relative to e.g. a scanning electron microscope or some kind of scatterometer. These apparatuses may include several other moving components such as a reticle stage, a wafer stage, mirrors, lens elements, light sources (e.g., a drive laser, an EUV source, etc.), a reticle masking stage, a wafer top cooler, wafer and reticle handlers, vibration isolation systems, stage torque compensators, software and/or hardware modules that control and/or include such components, and/or other components. These examples are not intended to be limiting.

Figure 6:
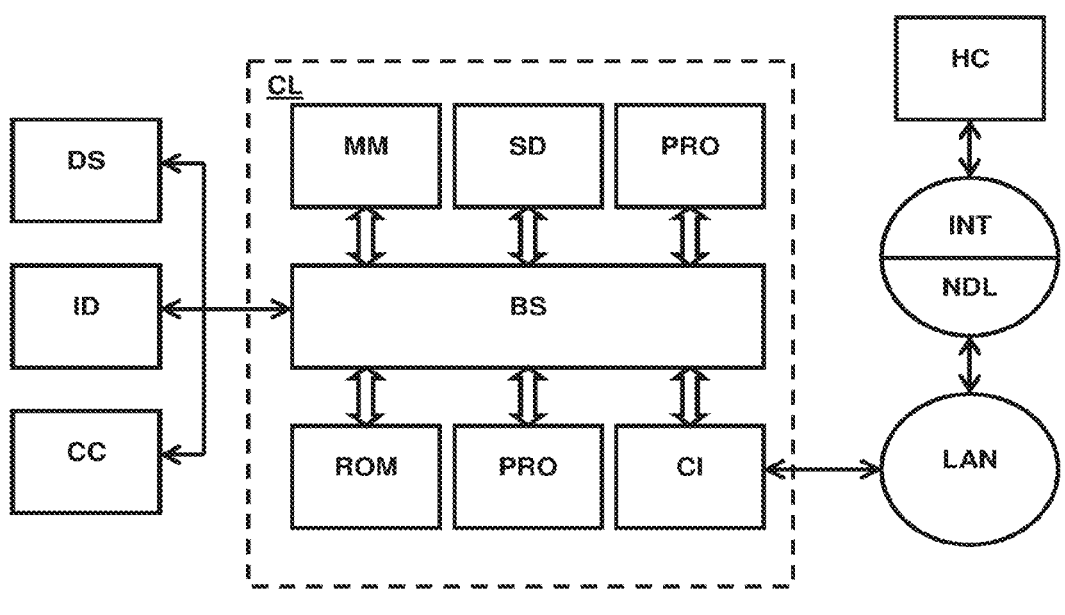
FIG. 6 is a block diagram of an example computer system, according to an embodiment.

FIG. 6 is a block diagram of an example computer system CL, according to an embodiment. Computer system CL may assist in implementing the methods, flows, or the apparatuses disclosed herein. Computer system CL includes a bus BS or other communication mechanism for communicating information, and a processor PRO (or multiple processors) coupled with bus BS for processing information. Computer system CL also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO, for example. Computer system CL includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CL may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, portions of one or more methods described herein may be performed by computer system CL in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CL can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CL may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CL, are exemplary forms of carrier waves transporting the information.

Computer system CL can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CL may obtain application code in the form of a carrier wave.

Figure 7:
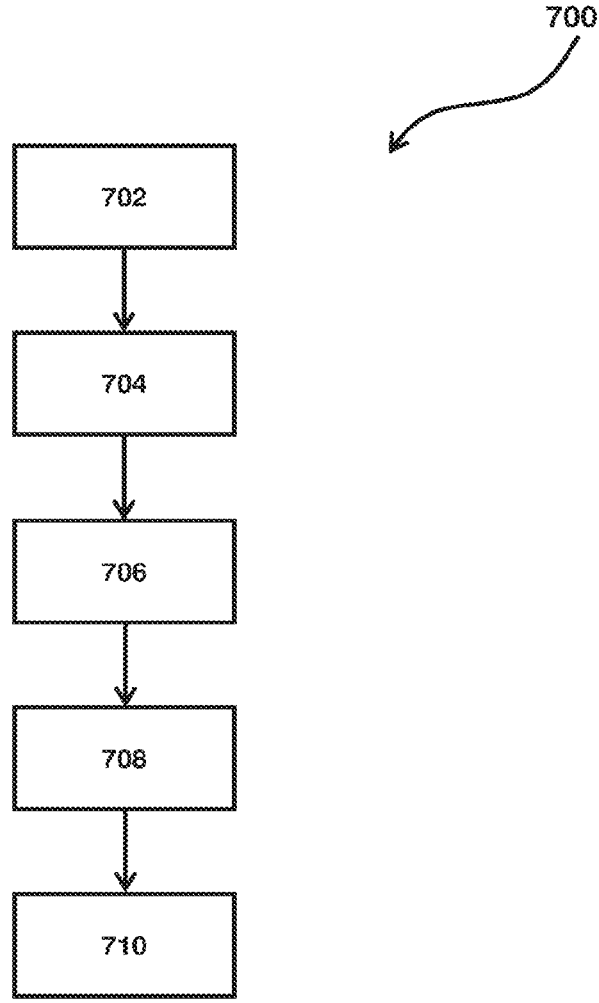
FIG. 7 illustrates a method for generating a control output for a patterning process, according to an embodiment.

FIG. 7 illustrates an example method 700 generating a control output for a patterning process. The patterning process is performed with a patterning process apparatus and/or other apparatuses. In some embodiments, the apparatus comprises a semiconductor lithography apparatus such as a scanner, an optical metrology inspection tool such as a scatterometer, an e-beam inspection tool such as a scanning electron microscope, and/or other apparatuses. Method 700 comprises training 702 a parameterized model such as a machine learning model; receiving 704 a control input; determining 706, with the parameterized model, a control output; controlling 708 the apparatus based at least on the control output; updating, fine-tuning, and/or otherwise re-training 710 the model, and/or other operations. In some embodiments, method 700 is performed for (or as part of) a semiconductor manufacturing process, for example.

The operations of method 700 presented below are intended to be illustrative. In some embodiments, method 700 may be accomplished with one or more additional operations not described, and/or without one or more of the operations discussed. For example, method 700 may not require training the parameterized (machine learning) model (e.g., the model may be pretrained). As another example, method 700 may or may not include actually controlling 708 an apparatus, and/or updating 710 the model. Additionally, the order in which the operations of method 700 are illustrated in FIG. 7 and described below is not intended to be limiting.

In some embodiments, one or more portions of method 700 may be implemented (e.g., by simulation, modeling, etc.) in one or more processing devices (e.g., one or more processors). The one or more processing devices may include one or more devices executing some or all of the operations of method 700 in response to instructions stored electronically on an electronic storage medium. The one or more processing devices may include one or more devices configured through hardware, firmware, and/or software to be specifically designed for execution of one or more of the operations of method 700, for example.

As described above, method 700 comprises training 702 a machine learning model. The machine learning model may be any parameterized model. In some embodiments, the machine learning model may be and/or include neural networks, and/or other machine learning models. For example, the machine learning model may be and/or include one or more artificial neural networks having an input layer, an output layer, and one or more intermediate or hidden layers. In some embodiments, the one or more artificial neural networks may be and/or include deep neural networks (e.g., neural networks that have one or more intermediate or hidden layers between the input and output layers). In some embodiments, the one or more artificial neural networks may include one or more convolutional neural networks (CNN), one or more recurrent neural networks (RNN), and/or other neural networks.

As an example, the one or more artificial neural networks may be based on a large collection of neural units (or artificial neurons). The one or more neural networks may loosely mimic the manner in which a biological brain works (e.g., via large clusters of biological neurons connected by axons). Each neural unit of an artificial neural network may be connected with many other neural units of the neural network. Such connections can be enforcing or inhibitory in their effect on the activation state of connected neural units. In some embodiments, each individual neural unit may have a summation function that combines the values of all its inputs together. In some embodiments, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the one or more artificial neural networks may include multiple layers (e.g., where a signal path traverses from front layers to back layers). In some embodiments, back propagation techniques may be utilized by the artificial neural networks, where forward stimulation is used to reset weights and/or biases on the "front" neural units. In some embodiments, stimulation and inhibition for the one or more neural networks may be more free flowing, with connections interacting in a more chaotic and complex fashion. In some embodiments, the intermediate layers of the one or more artificial neural networks include one or more convolutional layers, one or more recurrent layers, and/or other layers. By way of a non-limiting example, an artificial neural network may have multiple neurons distributed between an input layer, hidden layers, and an output layer. Such an artificial neural network may have sufficient degrees of freedom to capture non-linearities in multiple dimensions and compute control signals at a sampling rate appropriate for a patterning process on a typical computing system (e.g., a laptop).

The one or more neural networks may be trained (i.e., whose parameters are determined) using a set of training data (e.g., as described herein). The training data may comprise a plurality of training control input and corresponding training control output pairs. The training data may include a set of training samples. Each sample may be a pair comprising an input object (often formatted as a vector, which may be called a feature vector) and a desired output value (also called the supervisory signal). A neural network (e.g., the machine learning model) is configured to use a training control output as feedback to update one or more configurations of the machine learning model, where the one or more configurations are updated based on a comparison between the training control output and the predicted control output.

A training algorithm analyzes the training data and adjusts the behavior of the artificial neural network by adjusting the parameters (e.g., weights, biases, etc., of one or more layers and/or other parameters) of the artificial neural network based on the training data. For example, given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network g: $X \rightarrow Y$, where X is the input space and Y is the output space. A feature vector is an n-dimensional vector of numerical features that represent some object (e.g., a control input such as one or more patterning process parameters, a diffraction pattern image, a motion setpoint, a load sequence for a wafer and/or a reticle, etc., or a control output such as a feedforward signal, etc.). The vector space associated with these vectors is often called the feature or latent space. After training, the neural network may be used for making predictions using new samples (e.g., different patterning process parameters, diffraction pattern images, setpoints, load sequences, and/or other control inputs).

In some embodiments, a control input is used for controlling a patterning process. In some embodiments, the control input is associated with monitoring and/or diagnosing the patterning process. For example, a control input may comprise one or more parameters used to control the patterning process, a metrology parameter used to monitor the patterning process, an error (e.g., feedback) parameter used to diagnose the patterning process, and/or other information. The one or more parameters may define and/or otherwise be associated with a diffraction pattern image, wafer heating, lens heating, mirror heating, a motion setpoint, a load sequence for a wafer and/or a reticle, and/or other aspects of a patterning process. In some embodiments, the one or more parameters may comprise one or more lithography apparatus, optical metrology inspection tool, e-beam inspection tool, and/or other apparatus parameters, and/or associated lithography and/or inspection process parameters, for example critical dimension, overlay, focus, wavefront aberrations, and/or other parameters.

The training control inputs correspond to a plurality of operational conditions of the patterning process. The plurality of operational conditions of the patterning process are associated with specific configurations, modes, settings and states of the patterning process giving rise to specific behavior (changes in) of the patterning process over time. This may be related to process drift, apparatus component heating and/or cooling, apparatus component location, movement, and/or deformation, and/or other changes and/or behavior. In some embodiments, the training control inputs may be configured to represent process extremes, how those process extremes change over time, and/or other data. In some embodiments, actual process parameters, measurements, and/or other data may be collected for the patterning process for different time points and used as training control inputs such that the actual process parameters, measurements, and/or other data are representative of operational condition specific behavior of the patterning process over time (e.g., changes in the patterning process over time). In some embodiments, training control inputs may be simulated (e.g., based on known prior patterning process information). In some embodiments, training control inputs may be entered and/or selected by a user (e.g., via a user interface included as part of a computing system as described herein).

Training control outputs comprise data generated from simulation of the patterning process, actual process data, and/or other information. Simulation of the patterning process to generate training data may be performed with a physical model, for example. Simulations are based on the training control inputs such that a given control input and a simulated control output form a training pair as described above. In another example the simulations are based on knowledge of operational conditions of the patterning process. In some embodiments the simulation is performed by a physical model of the patterning process. In some embodiments the physical model may simulate the control output purely based on operational condition input.

In some embodiments, actual process data comprising measurements and/or other determinations made based on prior performance of the patterning process with the given control input may be used instead of and/or in addition to a simulated control output. Training control outputs may comprise simulated behaviour of one or more components of a processing apparatus, simulated feedforward signals, and/ or other information. These may include and/or be generated based on a plurality of simulated heating and/or cooling characteristics of one or more components of an apparatus; simulated forces, torques, currents, charges, voltages, and/or other information for a component that correspond to a plurality of motion setpoints (e.g., changing target parameters), and/or other information.

The trained machine learning model is configured to determine, based on a control input, a control output for the patterning process. The machine learning model is trained with the training data such that the machine learning model determines the control output regardless of whether the control input falls outside the training data. This means that the machine learning model can interpolate between known control inputs and corresponding control outputs, and/or extrapolate beyond the known control inputs and outputs, for example. This also effectively facilitates interpolation and/or extrapolation between processing conditions (e.g., if a model is calibrated for reticle A, C, and D, then a machine learning model may (without physical modelling) infer control input based on expected control output for a reticle B).

Method 700 comprises receiving 704 a control input for controlling a patterning process. As described above, a control input may comprise one or more parameters used in the patterning process, and/or other information. In some embodiments, the control input is associated with parameters for monitoring and/or diagnosing the patterning process. For example, the one or more parameters may define and/or otherwise be associated with a diffraction pattern image, wafer heating, lens heating, mirror heating, a motion setpoint, a load sequence for a wafer and/or a reticle, and/or other aspects of a patterning process. In some embodiments, the control input comprises a diffraction pattern image, a motion setpoint, a load sequence for a wafer and/or a reticle, and/or other control inputs, for example. In some embodiments, a control input may indicate a prescribed movement of an apparatus component. The control input may be received electronically from an apparatus and/or computing system associated with the patterning process (e.g., determined based on previous processing), entered and/or selected by a user (e.g., via a user interface included as part of a computing system as described herein), and/or received in other ways.

Method 700 comprises generating 706, with the machine learning model, a control output for the patterning process. The control output is determined with the trained machine learning model based on the control input and/or other information. The control output may be and/or include an adjustment of one or more patterning process parameters, and/or other information. In some embodiments, the control output comprises an adjustment of one or more parameters associated with monitoring and/or diagnosing a patterning process. This may include adjusting which metrology parameters are measured, how they are measured, when they are measured, and/or other adjustments. In some embodiments, a control output may comprise a feedforward signal, for example. The feedforward signal may specify the adjustment of the one or more parameters, for example. This may include instructions for changing the value of a parameter from one level to another (e.g., a dose, a power, etc.), changing the movement of one or more components of an apparatus (e.g., a position, a velocity, an acceleration, etc. of a clamp, stage, lens, etc.; a mirror arrangement, etc.), changing a process and/or movement recipe (e.g., changing which steps are included) and/or other adjustments. For example, in some embodiments, the control output comprises an adjustment of one or more parameters associated with motion control of one or more components of a patterning process apparatus.

In some embodiments, the control output may be and/or include an indication of how a patterning process and/or a patterning process apparatus (and/or one or more components included therein) changes based on a control input. For example, the control output may be and/or include an indication of how a lens, a wafer, and/or other components heat over time, and/or heat differently depending on different control inputs.

Method 700 comprises controlling 708 the patterning process apparatus based at least in part on the control output. Controlling 708 the patterning process apparatus may include generating a feedforward signal and/or other electronic signals. Controlling 708 the patterning process apparatus may include transmitting the feedforward signal and/or other electronic signals to the patterning process apparatus (and/or one or more individual components such as actuators of the apparatus). As described herein, the machine learning model can determine the control output regardless of whether the control input falls outside the training data. Machine learning models such as artificial neural networks are effective at interpolation and extrapolation.

Method 700 includes updating and/or fine tuning 710 the machine learning model. This includes updating and/or fine tuning the machine learning model over time by re-training the machine learning model with new actual process data from the patterning process. Training 702 the machine learning model with simulated and/or actual process training data from the patterning process may be thought of as an initial calibration, for example. The re-training comprises configuring the machine learning model to be fine-tuned with one or more drift calibrations configured to account for drift that occurs in the patterning process over time. The training 702 and/or updating/fine tuning 710 may generate one or more coefficients for the machine learning model. The one or more coefficients may include layer and/or individual neuron weights and/or biases, for example, and/or other coefficients. These coefficients may change over time responsive to the model being retrained/updated/tuned, manual adjustment by a user, and/or other operations.

In some embodiments, the training 702 and/or updating/ fine tuning 710 is off-line, online, or off-line and online in combination. Offline training may comprise a procedure that takes place separately from the patterning process and/or the patterning process apparatus. This means that machine (apparatus) production (e.g., semiconductor manufacturing) does not need to be interrupted while training and/or updating the machine learning model. Online training comprises training with the machine (apparatus) while production manufacturing is ongoing. This may require production to be interrupted as the machine (apparatus) is required to perform training motions.

In some embodiments, the machine learning model is configured to be updated over time by fine-tuning the machine learning model with new actual process data from the patterning process. In some embodiments, the machine learning model is configured for: receiving local actual process data associated with a production environment local patterning process with the machine learning model to determine first updated model parameter values; receiving second updated model parameter values obtained by providing the machine learning model at least partially with external training data, the external training data indicative of patterning process apparatus to apparatus variation; and adjusting the machine learning model by updating initial model parameter values with the first and/or second updated model parameter values. For example, the local actual process data may be generated by a manufacturer running the patterning process at a local site. As new local actual process data is generated, it may be fed to the machine learning model to facilitate re-training (e.g., updating/fine tuning) of the model. This may include generating the first updated model parameters, for example. In addition, the machine learning model may be configured to receive updates comprising the second updated model parameters from an external supplier or programmer who originally created the model. These parameters may be determined based on data generated outside the local site, for example.

Specific examples and/or applications of the operations of method 700 and/or the present machine learning model are described in the Examples and figures discussed below.

Example 1

Motion Setpoints and Drift

Advantageously, the present machine learning model is configured to be trained based on various control inputs (as described herein) to account for relevant variations in setpoint and disturbance forces in the parameter space, which includes position, velocity, and acceleration (e.g., of a wafer and/or reticle stage, etc.), and also relevant variations in lithography apparatus (e.g., a scanner) stepping, thermal drift, long term drift, cooling hood effects, immersion hood effects, tribological-mechanical control effects, and/or other effects associated with a patterning process.

For example, reaction forces during stepping in a patterning process apparatus such as a scanner excite dynamics that are not fully damped when a scan starts, especially when targeting zero settling time. This effect can be represented by the stepping acceleration (i.e., magnitude) and stepping time (i.e., phase), which may be included in the control input parameters used to train the machine learning model. An actuation response (e.g., of an actuator and/or other components in a scanner) may drift when heating up, which can be observed by a temperature sensor in the cooling water return channel of the actuator. The temperature of the water in the cooling water return channel may be included in the control input parameters used to train the machine learning model. A patterning process apparatus response might change over time (e.g., over the long term) due to aging effects such as wear and contamination. These effects typically are correlated to the number of step-and-scan motions (i.e., wear) and the number of exposed wafers (i.e., contamination by resist outgassing), which may be included in the control input parameters used to train the machine learning model. The pressure of the cooling hood deforms the wafer, especially near e-pin holes and/or other similar features, and affects the wafer stage control. This effect can be represented by the cooling hood pressure setpoint, which may be included in the control input parameters used to train the machine learning model. One or more immersion hood control input parameters may also be used to train the machine learning model. Tribological mechanical control input parameters may include parameters related to wafer slip, reticle slip, wafer load grid, reticle load grid, and/or other parameters. These examples are not intended to be limiting. One or more further control input parameters may relate to: the number of wafer/reticle loads and wafer load parameters like speed and pressure profile, which all relate to wafer/reticle load control and wear (drift).

Once trained with these and/or other control input parameters (and corresponding training control outputs), the machine learning model is configured to generate corresponding control outputs for new control inputs. Such control outputs (e.g., adjustments of one or more of these and/or other parameters) may be used for enhanced motion control of one or more components of the patterning process apparatus. For example, this may comprise controlling actuation of a scanner by controlling movement of a wafer and/or reticle stage of the scanner, an adjustment of one or more parameters associated with tribological-mechanical control of one or more components of a patterning process apparatus, and/or other motion control (these are non-limiting examples among many possible other examples).

Figure 8:
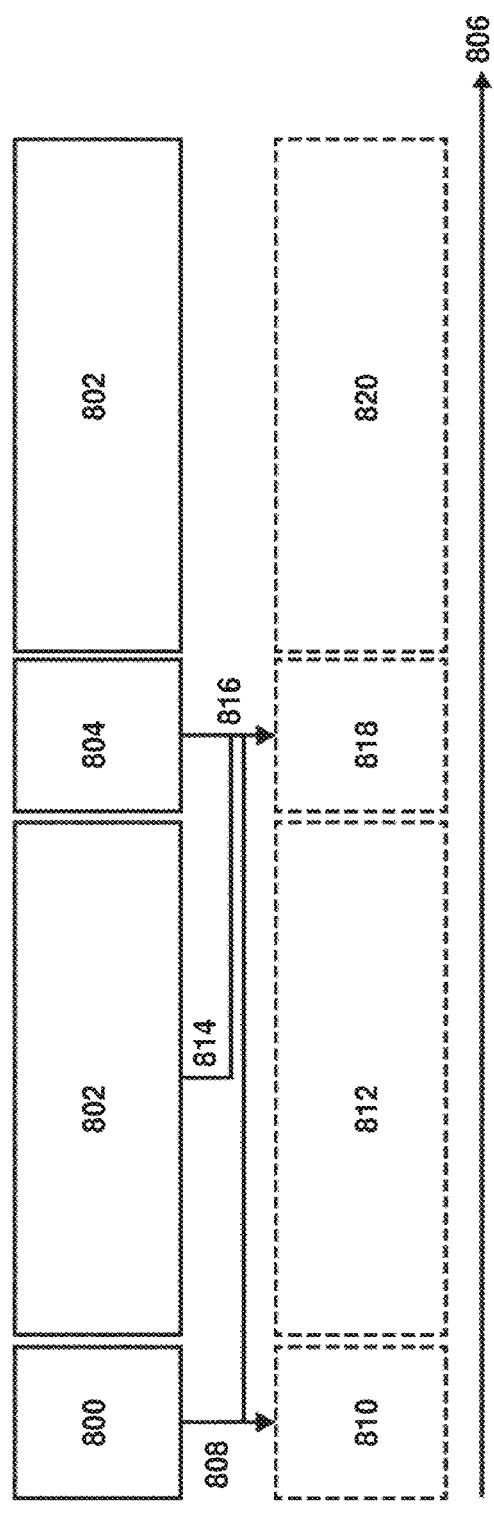
FIG. 8 illustrates an initial training and a drift calibration, according to an embodiment.

In this example, training may be divided into an initial training (e.g., 702 shown in FIG. 7) and a drift calibration (e.g., updating/fine-tuning/re-training 710 shown in FIG. 7). This is illustrated in FIG. 8. FIG. 8 illustrates a patterning process set up 800, high volume production 802, maintenance 804, and continued high volume production 802 over time 806. Initial control inputs and outputs 808 (e.g., iterative learning control data in this example) are provided to the machine learning model to train 810 the machine learning model. The machine learning model is then run 812 during high volume production 802 with initial machine learning model parameters. Actual data from high volume production 802 is provided 814 to the machine learning model along with initial inputs and outputs 808 and updated inputs and outputs 816 to update/tune/re-train 818 the machine learning model. The updated/tuned/re-trained machine learning model may then be used 820 for continued high volume production 802. In initial training or calibration 810, performance-critical parameters of the machine learning model are calibrated before high-volume production by a customer, for example. Updating/tuning/re-training 818 may comprise a drift calibration, where the machine learning model parameters are re-calibrated after a period of high volume production. This may occur during a scheduled maintenance, for example.

As shown in FIG. 8, the machine learning model may be trained with previous data, new data, with drift parameters, and/or other information. Examples of drift parameters include parameters related to 1) impact of wear and contamination on tribological properties, e.g., parameters related to the wafer table holding the wafer, causing a clamping overlay penalty fingerprint which "evolves" over time causing overlay issues, 2) sensor drift due to deformations of glue connections (as most glues deform when subject to air with varying levels of humidity), 3) thermal drifts (depending on day/night cycle, or machine-heat-sources), and/or other examples. These parameters can be estimated using performance data over time (i.e. overlay) and optionally direct measurement data of the drift-inducing variable, such as a temperature, power level.

Using such training data, the machine learning model can learn to predict drift in continued high volume production. In some embodiments, the drift can be modeled by a separate machine learning model, or integrated in the initial model as described above, using a set of different parameters that relate to those drift such those described above, dependent on the application. In some embodiments, the training may be completed "online" as described above, in addition to and/or instead of the "offline" training shown in FIG. 8.

Example 2

Wafer Heating Correction

In some embodiments, the control output comprises an adjustment of one or more parameters associated with thermal expansion of the one or more components of a patterning process apparatus. In some embodiments, the control output comprises a wafer heating control adjustment, where determining the control output comprises predicting an overlay fingerprint and/or a focus fingerprint, and determining the wafer heating control adjustment based on the predicted overlay fingerprint and/or focus fingerprint.

For example, the wafer heating effect is recognized as a significant contributor to overlay and focus fingerprints on a wafer, often being up to 10 nm in magnitude. A changing thermal deformation of the wafer (and clamp) during an exposure is caused by the absorption of EUV and IR radiation by the wafer (and clamp), and cooling of the wafer (and clamp) by a continuous flow of cooling gas and a flow of water through cooling channels. A fingerprint depends on a design layout, routing (the specific pattern of scanning motion across the wafer), and on several machine specific parameters (e.g., whether radiation is IR/EUV, a source power, the heat transfer coefficient from clamp to cooling water, a tangential burl stiffness, etc.), as well as other product specific parameters (e.g., a product stack, a wafer coating, reticle transmission parameters, dose, etc.)

Several versions of physical simulation models have been developed in order to predict the overlay and focus fingerprints. These wafer heating correction models take the above-mentioned parameters as input, and help to mitigate the overlay and focus impact, by adjusting feedforward signals to compensate and correct for the wafer heating effect, via scanner actuation.

Typical wafer heating correction models estimate the input heat loads and compute the evolution of temperature of the wafer and clamp. This is used to estimate the thermo-mechanical deformation of the wafer (and clamp), to eventually predict the impact on both overlay as well as focus (e.g., by predicting related parameters). A correction per exposure (CPE) is then used to determine the required scanner actuation feedforward signal adjustments.

Most meaningfully accurate versions of physics-based (e.g., physical) wafer heating control models have a non-trivial computational cost ranging from a few seconds to a few hours per wafer. Further, the predictions from the physical model wafer heating control simulations can be off by about two nm in some cases.

For example, in an inline wafer heating feedforward correction (WHFF) operation, for a given dynamically changing heat load, thermal differential equations are solved, and the corresponding mechanical deformation of the wafer is obtained through an expensive matrix multiplication, with a large deformation matrix being pre-computed. This so-called C-matrix depends on burl (e.g., wafer supports) stiffness and has dimensions of ~9 k×12 k. A new/different calculation is need for each wafer.

As another example, for a wafer heating calibration model, an exposure is made on a fixed layout with a predetermined routing, using a combination of high and low transmission reticles. This test attempts to determine physical model parameters that are machine and clamp specific, using overlay data. This helps in the determination of a relationship between thermal evolution and wafer deformation, which is then used in the inline wafer heating feedforward correction. These machine and clamp specific parameters are obtained through a least-squares optimization using the exposed overlay data. This optimization is computationally expensive, often taking in excess of 30 minutes to converge to the optimal parameters.

As a third example, improvement in the accuracy of the wafer heating calibration model may be achieved by either detailing more process physics, and/or by better numerical resolution in FEM simulations. This add significantly to the computational expense of the simulation.

Figure 9:
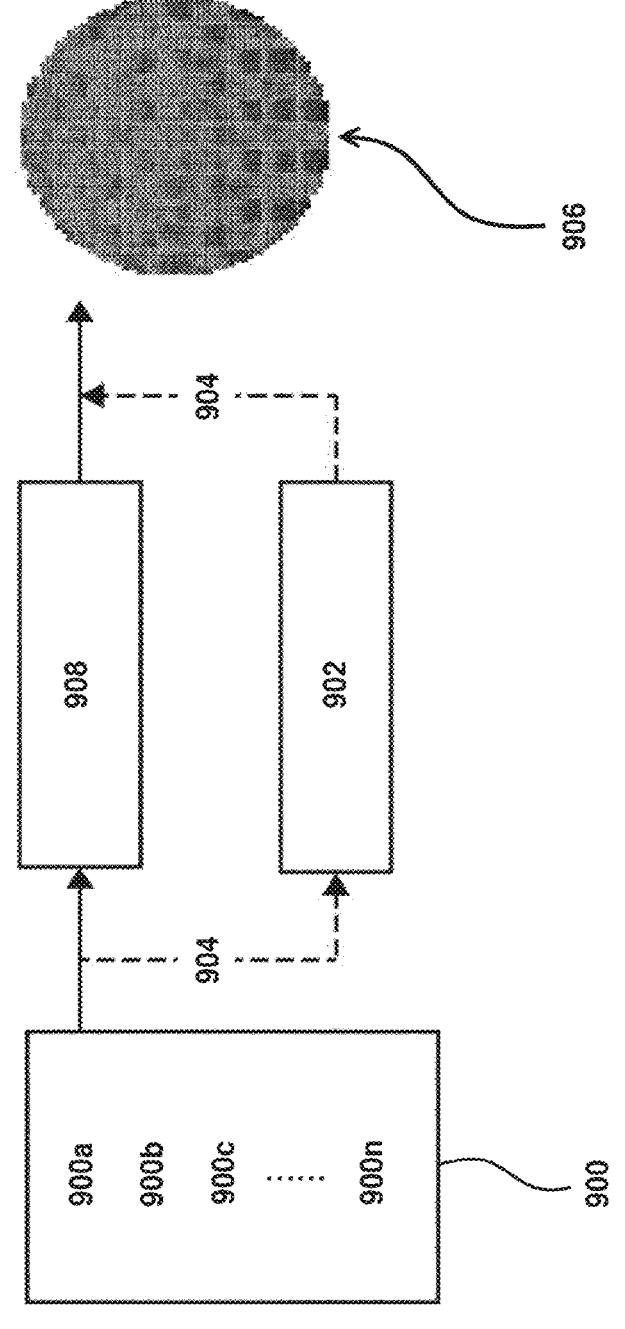
FIG. 9 illustrates a present machine learning model used as a surrogate modelling technique for modelling wafer heating correction with a physical model, according to an embodiment.

The present machine learning model may be used as a surrogate modelling technique for modelling wafer heating correction with a physical model. This is illustrated in FIG. 9. FIG. 9 illustrates a series 900 of control input parameters 900a . . . 900n (e.g., dose, a designation of EUV or IR radiation, a design layout, routing, burl stiffness, etc.) and using the present machine learning model 902 as a surrogate 904 modelling technique for modelling wafer heating correction (e.g., an EUV wafer heating overlay fingerprint) 906, instead of using a physical model 908. Physical model 908 may be computationally expensive when configured for highly accurate predictions. In contrast, machine learning model 902 is relatively computationally cheap, and provides similar or better accuracy compared to present physical models. The present machine learning model enables an improvement in modelling speed and accuracy compared to a physical model, and opens several possibilities to further improve and fine-tune modelling performance.

The present machine learning model is trained to emulate the behaviour of physical models as closely as possible, while being significantly computationally cheaper to operate. The present machine learning model is still a physics compliant approach, as the present machine learning model is trained using simulated data generated by a physical model, and/or actual process data as described above. In this example, the machine learning model learns the relevant physics of the wafer heating problem, by learning relationships between control inputs (patterning process parameters) and control outputs (e.g., overlay/focus predictions in this example).

Advantageously, the machine learning model provides an extremely flexible modelling approach that can be trained to faithfully replicate a very wide range of control inputs and outputs. At the same time, since the predictions from the machine learning model involve (a large number of) matrix computations, modulated through a non-linear (activation) function, generation of control outputs is typically achieved at a tiny fraction of the computational cost of a physical model. To summarize, the machine learning approach provides a very fast computation of the input-output relationship for a very large class of such models (relationships).

As described above, in some embodiments, the machine learning model may be and/or include artificial neural networks (ANN) with many hidden layers. The architecture of such a network (i.e., the number of layers, a number of nodes in each layer, connections between layers, etc.) is determined depending on the problem (e.g., wafer heating correction in this example). To ensure that the machine learning model accurately predicts wafer heating physics, the machine learning model may be trained using many simulated training control input/output pairs examples generated at least partially using a physical model. The training control input/output pairs are generated across the relevant patterning process parameter space, in a space-filling random design (i.e., with no large gaps in the parameter space).

Once trained, the predictions from the machine learning model may be validated across randomly chosen points over the same parameter space, by comparing the predictions to those from the physical simulation (e.g., as described above—see operation 710 illustrated in FIG. 7).

As described above, the process of training the machine learning model involves two main steps: initially training the machine learning model using control input/output pairs generated at least partially based on physical simulations, and updating/fine tuning/re-training the model to enhance model parameters (e.g., to make model predictions even more accurate). Training/updating/fine tuning/re-training can be offline (e.g., utilizing a high-performance computing platform, and/or a cloud computing platform (e.g. Google cloud)), online, or offline and online in combination. In some embodiments, the updating/fine tuning/re-training may be performed using actual patterning process data from a manufacturing environment and/or other data.

Some aspects of the of the wafer heating problem that are manufacturing environment specific (for example wafer ingot, resist, coating properties, etc.) might either not be known sufficiently well, or may not be sharable outside the manufacturing environment (e.g., a customer may not want to share data with a supplier and/or other customers). In addition, at least some physics relevant to the wafer heating problem may be too complex to be simulated sufficiently well with a high degree of accuracy (such that actual process data is helpful for training the machine learning model).

In some embodiments, transfer learning may be used to update/fine-tune/re-train the machine learning model. Transfer learning facilitates accurate modelling, without sharing sensitive information. For example, the present machine learning model may be configured such that only model parameters corresponding to the last few layers of an artificial neural network are trained using actual (e.g., local) process data (e.g., with the machine learning model having been sent to a customer for the updating/fine tuning/re-training), while the model parameters corresponding to other layers of the machine learning model (e.g., modelling simulated physical relationships) are kept fixed.

In some embodiments, federated learning may be used to update/fine-tune/re-train the machine learning model. In contrast to an approach where actual process data is uploaded to a central location (e.g., for the model supplier/programmer to use to train the model), federated learning seeks to exchange, between the model supplier/programmer and its customers, only the parameters of the model, to be trained on the local customer data. Federated learning across a wide base of scanners, across customers, generates enough data to enable a meaningful improvement in the scanner performance (e.g., by way of a machine learning model trained as described herein).

In some embodiments, transfer and/or federated learning may use a virtual computing platform located in a remote location (e.g., at a customer site). The virtual computing platform is a scalable and high availability big data ready software platform that supports and catalyzes the adoption of fab applications to be used in a high volume manufacturing environment (HVM). This facilitates re-training of the machine learning model at the remote location, using the virtual computing platform. By using a virtual computing platform, the performance of the fine-tuned models can be further monitored, and when required, may be re-trained with new local data (for example from a change in a customer process, wafer table swap action, etc.). Similarly, for the federated learning approach, the relevant parameters of the machine learning model may be exchanged with a customer and trained on customer data in the virtual computing platform. The updated parameters may then be shared back with the model supplier/programmer.

Figure 10:
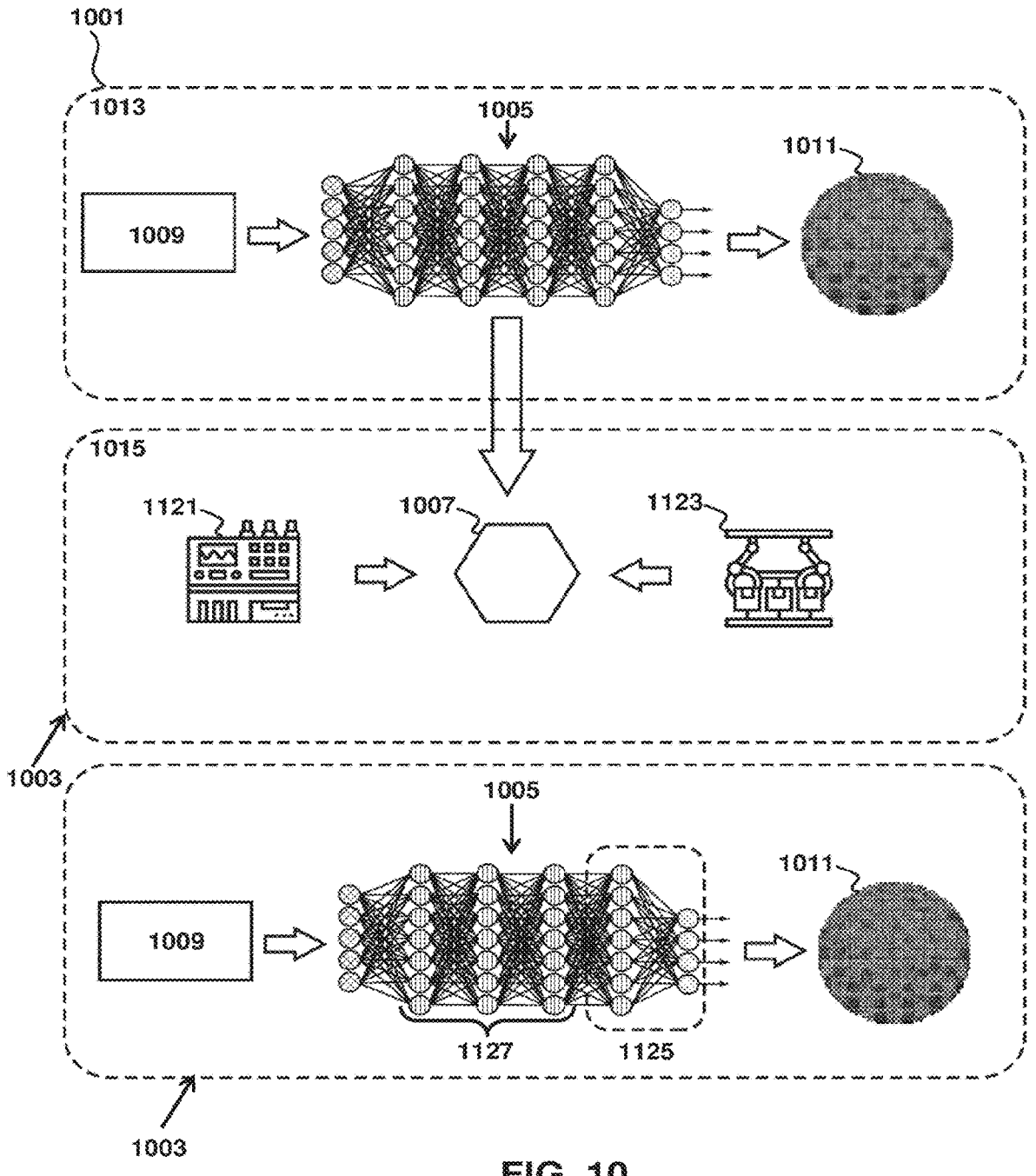
FIG. 10 illustrates training and updating/fine-tuning/re-training a present machine learning model using transfer and/or federated learning and a virtual computing platform, according to an embodiment.

FIG. 10 illustrates training 1001 (e.g., operation 702 shown in FIG. 7) and updating/fine-tuning/re-training 1003 (e.g., operation 710 shown in FIG. 7) a present machine learning model 1005 using transfer and/or federated learning and a virtual computing platform 1007. FIG. 10 illustrates training 1001 comprising providing control input parameters 1009 to machine learning model 1005 for modelling wafer heating correction (e.g., an EUV wafer heating overlay fingerprint) 1011. This may occur at a site associated with the model provider/programmer 1013 (e.g., a remote or external site relative to a customer manufacturing environment) and/or in other locations. Model 1005 may be updated/fine-tuned/re-trained (e.g., personalized) 1003 in a local customer manufacturing environment 1015 via virtual computing platform 1007 as described herein. The updating/fine tuning/re-training 1003 may be performed based on local scanner data 1121, local metrology data 1123 (e.g., wafer heating control residuals), and/or other local information. As shown in FIG. 10, in some embodiments, transfer and/or federated learning may be used to update/fine-tune/re-train the machine learning model. By using a virtual computing platform, the relevant parameters of the machine learning model (e.g., parameters associated with layers 1125 closest to an output layer as opposed to deeper layers 1127) may be trained on local customer data in the virtual computing platform, and/or with other computing resources.

It should be noted that although wafer heating is described in the example above, the same or similar principles may be applied for accurate modelling of reticle heating, and/or heating of other patterning process apparatus components.

Example 3

Dynamic Lens Heating

A dynamic lens heating model is typically a physical model used to predict lens heating based on lens type. A dynamic lens heating model may be used to simulate raw lens heating parameters (e.g., mu, tau, and/or other parameters) for a given use case with a given heat load for a scanner with a corresponding lens type. A simulated aberration per field order through time can be parameterized by mu and tau parameters. In some embodiments, mu parameters are scaling factors which imply how large lens heating could be when a lens is saturated. Tau parameters are time constants which imply how fast the lens may be heated or cooled. In some embodiments, other raw lens heating parameters may be simulated and fit to mu/tau values per Zernike, and per field order. These mu/tau values can be used for scanner lens heating feedforward control to compensate for the effects of lens heating during an exposure. An accurate physical dynamic lens heating model is computationally expensive for many reasons including the fact that (EUV) lens heating is highly nonlinear.

In contrast, the present machine learning model is relatively computationally inexpensive. The present machine learning model may be used to improve lens heating parameter prediction accuracy, reduce the development time required for further lens heating physical model development, and/or for other purposes. As described herein, the machine learning model may be trained with simulated and/or actual training data (e.g., corresponding training control inputs and outputs), and then updated/fine-tuned/retrained with actual data from a patterning process, and/or other information. In this example, the training data may be tailored for accurate dynamic lens heating parameter modelling (e.g., including modelling adjustments to and/or based on such parameters).

In this example, training data may be generated with a physical Dynamic Lens Heating Analyzer (DyLHan) model. For a lens type with its own DyLHan model available, training data may be generated with that DyLHan model. For a lens type without its own DyLHan model calibrated, training data may be generated with a known DyLHan model for another lens type with a similar lens design. For lenses with the same lens type, if lens to lens variation is considered, lens specific data may be generated with a DyLHan+lens specific calibration (LSC) model.

In this example, the training data generated via simulations may be used to pre-train the machine learning model to mimic a baseline DyLHan model. In some embodiments, diffraction pattern images (and/or parameters related to diffraction pattern images) may be used as a machine learning model control input, and the machine learning model may output mu/tau parameter values (which may be used as described below), other parameters, and/or adjustments to such parameters. In some embodiments, diffraction pattern images and historical lens heating sequences (and/or parameters related to this data) may be used as input, and the machine learning model may output raw lens heating behaviour parameters, mu/tau parameters, other parameters, and/or adjustments to such parameters. In this example, the machine learning model may comprise one or more of a deep convolutional neural network, recurrent neural network, and/or other neural networks.

In some embodiments, automated lens heating calibration data (e.g., inline measured data from an actual patterning process) may be used to perform transfer learning to fine-tune the trained machine learning model. As described herein, this improves the matching between model predictions and measurement realities. In some embodiments, measurement data from a single patterning process apparatus (e.g., scanner) may be used to fine-tune a model for that specific patterning process apparatus. In some embodiments, measurement data from multiple patterning process apparatuses (e.g., scanners) may be used to fine-tune the machine learning model. If lens to lens variation is considered, lens specific data may be generated with a DyLHan+lens specific calibration (LSC) model and used for fine-tuning.

Figure 11:
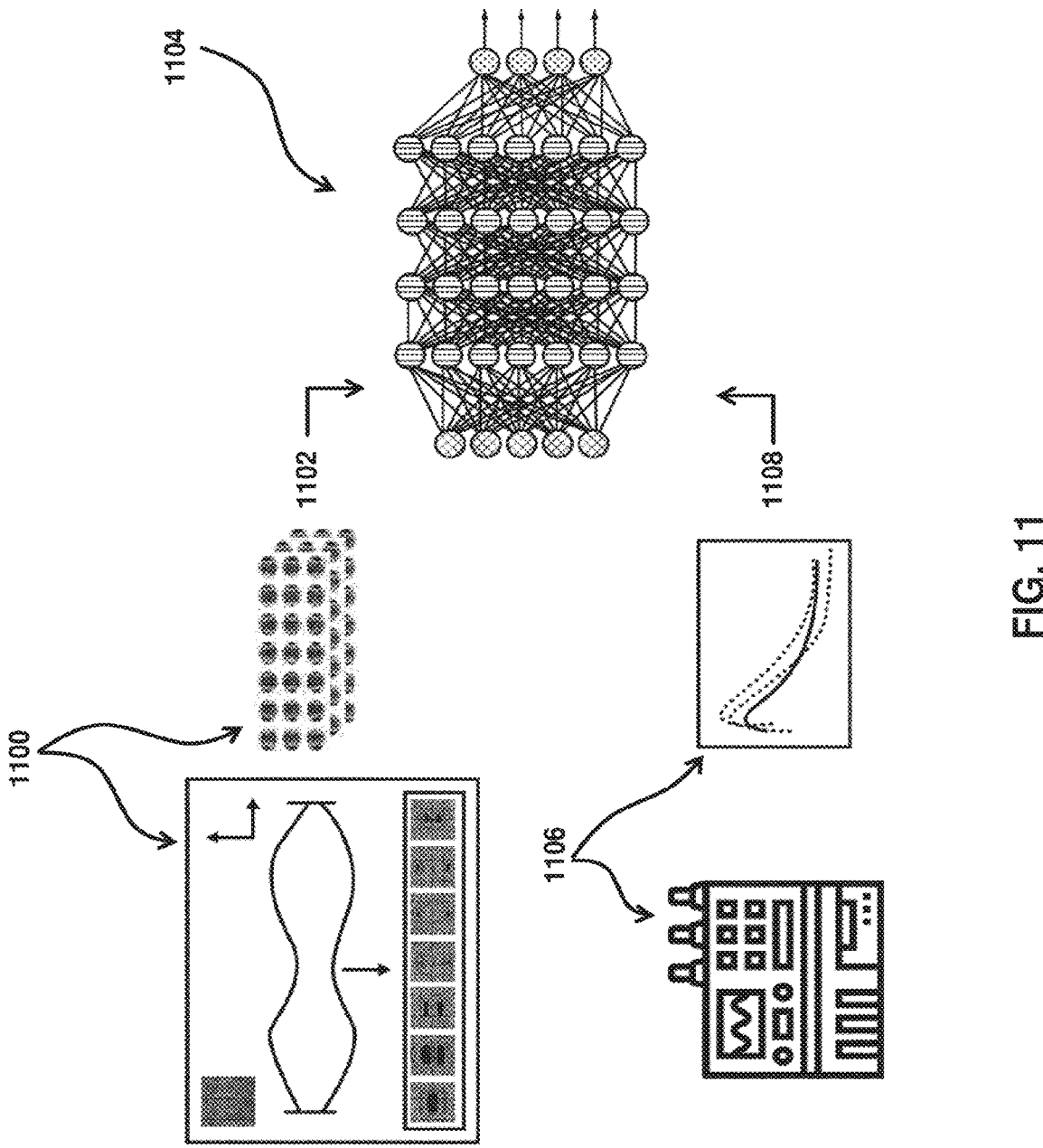
FIG. 11 illustrates how training data generated via simulations may be used to train a present machine learning model to mimic the baseline dynamic lens heating analyzer model, and how automated lens heating calibration data (e.g., inline measured data from an actual patterning process) may be used to perform transfer learning to fine-tune the trained machine learning model, according to an embodiment.
Figure 12:
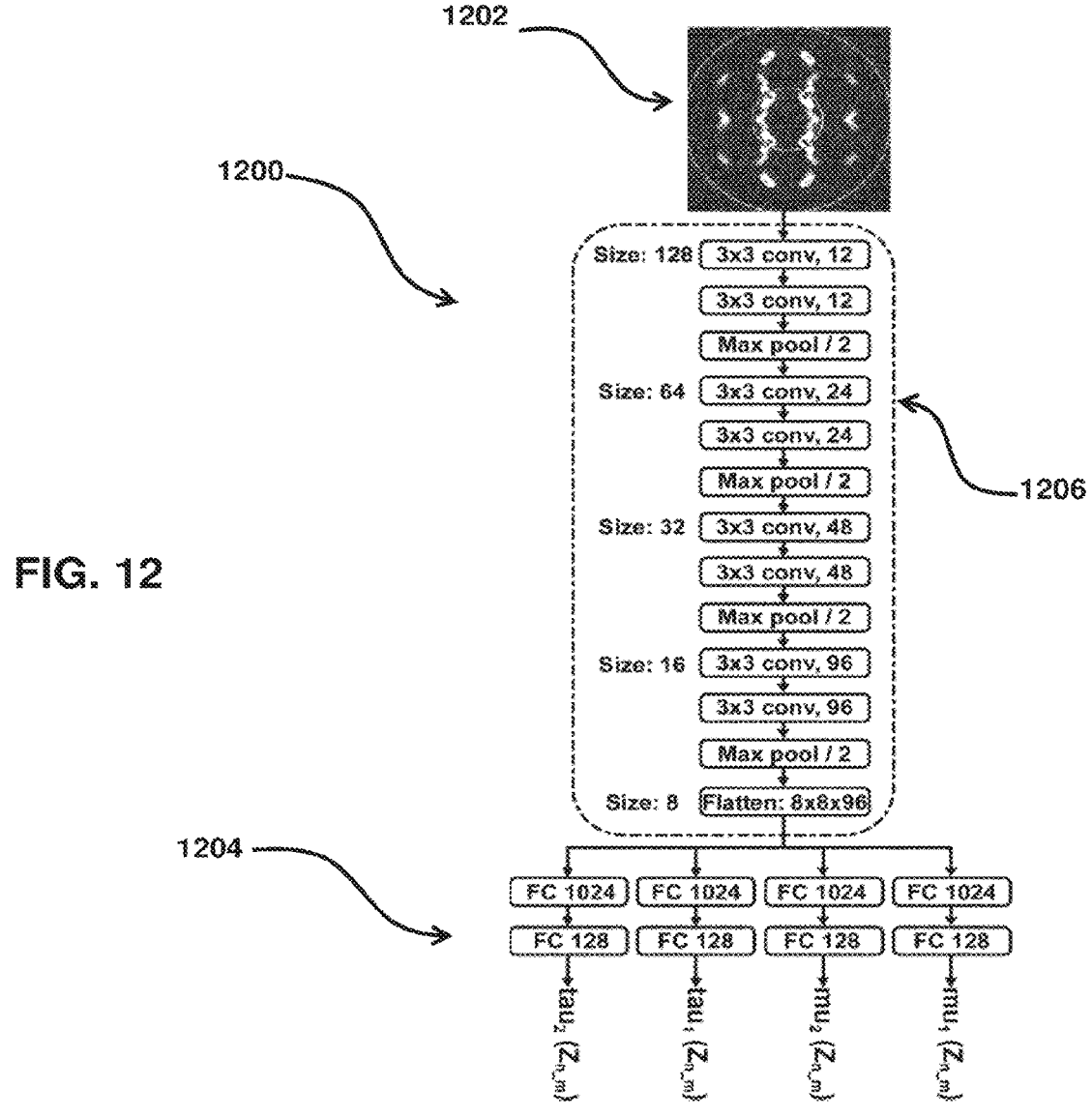
FIG. 12 illustrates an example of the present machine learning formed as a deep convolutional neural network, according to an embodiment.

By way of a non-limiting example, FIG. 11 illustrates how training data 1102 generated via simulations may be used to train a present machine learning model 1104 to mimic a baseline dynamic lens heating analyzer model 1100, and how automated lens heating calibration data 1106 (e.g., inline measured data from an actual patterning process) may be used to perform transfer learning to fine-tune 1108 the trained machine learning model. By way of a second non-limiting example, FIG. 12 illustrates an example of the present machine learning formed as a deep convolutional neural network 1200. As shown in FIG. 12, the deep convolutional neural network model may be used to map a diffraction pattern image 1202 to lens heating behaviours per field order parameterized by mu/tau 1204 (e.g., with mu/tau parameters being output by the model). Neural network 1200 may have any number of layers 1206 and/or any number of nodes per layer (e.g., as noted in each layer in FIG. 12) that allow the machine learning model to function as described herein.

In some embodiments, the trained machine learning model may be used to generate a control output comprising a lens heating control adjustment. This may include adjustment of one or more parameters of a cost function associated with lens heating, and/or other control outputs. As an example, the control output may comprise an adjustment of one or more parameters associated with controlling flexwave heating elements in a lens of a scanner, and/or other adjustments. In some embodiments, determining such a control output comprises: predicting mu tau parameter values associated with lens heating, a lens heating feedforward time sequence, and/or a lens heating field time sequence; determining a lens heating cost function based on the mu tau values, lens heating feedforward values, and/or lens heating field values; determining machine learning model parameter weights based on the lens heating cost function; determining the lens heating control adjustment based on a lens heating prediction by the machine learning model, and/or other operations. In some embodiments, the cost function is used to determine the weights in the machine learning model. The fine tuning is performed based on final model predictions after the model training has converged.

Figure 13:
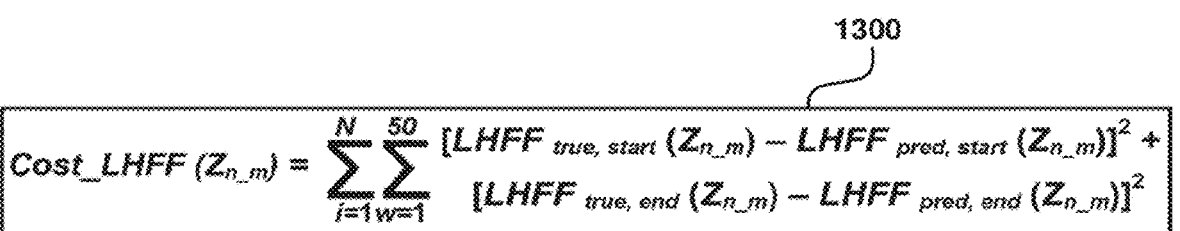
FIG. 13 illustrates determining a lens heating cost function based on predicted mu tau and/or LHFF values, according to an embodiment.
Figure 13:
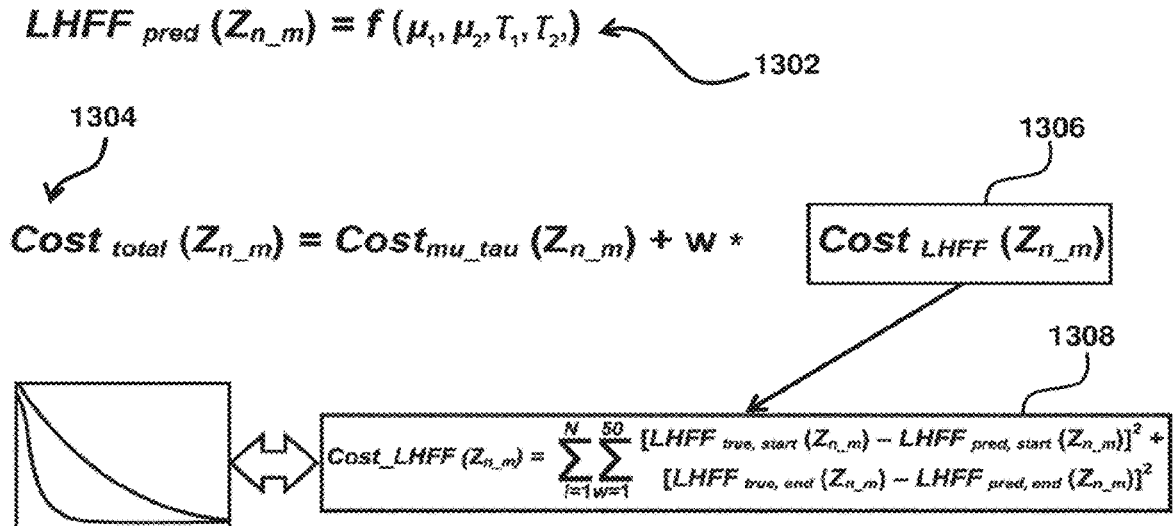

For example, FIG. 13 illustrates determining a lens heating cost function based on mu tau and/or lens heating feed forward (LHFF) values. In this example, the machine learning model is configured to predict mu/tau parameter values for individual Zernike/field order combinations. A mu tau and/or lens heating feedforward based cost function may be implemented to mitigate the impact of fitting artifacts. An example initial function is shown in box 1300 of FIG. 13. This example was generated based on a portion of a patterning process having 100 time steps in total, for 50 wafers (accounting for a beginning and an end of wafer exposure). In this equation LHFF represents a predicted lens heating feedforward control signal, $Z_{n\_m}$ stands for each field order decomposed from a Zn coefficient (the n-th Zernike polynomial) through field location across the slit. For example, Z5_0, Z5_1, Z5_2 and Z5_3 represents offset, tilt, curvature and third order decomposed from Z5 through field location. True stands for the ground truth which is calculated from a physical (e.g., dynamic lens analyzer) model. Pred stands for the prediction from the machine learning lens heating model. Start stands for the start of each wafer exposure. End stands for the end of each wafer exposure. The predicted LHFF in the LHFF cost can be written as an explicit function of $mu_1$, $mu_2$, $tau_1$, and $tau_2$. This equation is shown at reference numeral 1302 in FIG. 13. In some embodiments, the degenerating nature of mu, tau for LHFF mapping may lead to sub-optimal training of the machine learning model for a mu/tau-based cost function. In some embodiments, a weighting factor may be added to the cost function and tuned to weigh the LHFF cost term against the original mu/tau based cost term. This is shown by reference numerals 1304, 1306, and 1308 in FIG. 13. Specifically, with mu/tau as output, a hybrid cost function beyond mu/tau based one with optimal weight for LHFF term is introduced to reduce the model error effectively, according to the equation:

$$\text{cost}_{total}(Z_{n\_m}) = \text{Cost}_{mu\_tau}(Z_{n\_m}) + w^* \text{Cost}_{LHFF}(Z_{n\_m})$$

where $\text{Cost}_{mu\_tau}(Z_{n\_m})$ is a cost associated with the predicted mu tau values, w is a weighting term, and $\text{Cost}_{LHFF}(Z_{n\_m})$ is a cost associated with the lens heating feedforward control signal. In some embodiments, the model may be configured to predict the LHFF field order temporal sequence or the raw LHFF field data through-slit temporal sequence directly using a recurrent neural network approach. In this embodiment, the cost function only includes the 2nd term (the pure LHFF term), for example.

It should be noted that although lens heating is described in the example above, the same or similar principles may be applied for accurate modelling of mirror heating, reticle heating and/or heating of other patterning process apparatus components.

In another example a method of optimizing parameters used in (feedforward) control of a reticle heating caused disturbance is disclosed.

Currently feedforward control mechanisms are in place to correct for heating induced deformation of a patterning device (reticle) to mitigate potential overlay error due to said heating induced deformation. Current methods use a feedforward mechanisms based on an expected evolution of predetermined reticle deformation modes in time based on the heating history of the reticle and further context of the use of the reticle; for example the transmission of the reticle, the intensity of the light spot illuminating the reticle during an exposure sequence and the size of the light spot illuminating the reticle (field size). The geometrical (in plane) deformation modes may be interpreted as principal modes of heating induced deformation geometries which can be determined for example by performing Finite Element Method (FEM) based simulation of an exposure sequence of the reticle of interest subject to a context relevant for the reticle of interest. In essence the current reticle heating feedforward correction mechanism is based on deformation modes obtained by physical (FEM) modelling of a reticle heating process. The feedforward correction framework may further comprise (output) parameters relating to the time dependent behaviour of each of the deformation modes, for example tau/mu values and weighting factors for each of the deformation modes. Based on the output parameters of the physical model the lithographic apparatus may control the exposure process taking reticle heating effects into account.

In practice it has been observed that the accuracy of said physical model based reticle heating deformation modes is limited due to limitations of: the physical model parameters, uncertainty on the reticle heating history and the accuracy of the assumed context parameters (field size, light intensity, reticle transmission). In addition the initial state of the reticle like its initial temperature is often not known and can significantly limit the accuracy of any physical modelling of the reticle heating process. All of these factors may significantly reduce the accuracy of the determined reticle heating deformation modes and consequently reduce accuracy of the presumed reticle heating induced deformation evolution (during one or more exposure sequences). The latter may significantly compromise overlay accuracy as the feedforward correction mechanism will suffer from the introduced inaccuracies.

One solution to the mentioned inaccuracy problem may be the inclusion of data driven methods to supplement physically modelled deformation evolution. An example of such data may be actually measured Reticle Align (RA) data which comprises position data of selected metrology marks on the reticle relative to a reference co-ordinate system (typically associated with the lithographic tool used in exposing the reticle). Obtaining RA data at multiple time intervals during a sufficiently long sequence of exposures may provide a detailed (experimentally, empirically) insight into the actual evolution and the actual geometry of the reticle heating induced deformation modes associated with a certain reticle and a certain context (parameter set).

The implementation of said data driven method proposed in this document involves the use of a Machine Learning (ML) model. (Neural Network (NN) based, for example according to an autoencoder or Generative Adversarial Network (GAN) configuration) together with a physical model.

In the proposed configuration the physical model is used an initial model (starting point), the physical model may further be based on fine tuning of the model parameters using said RA data to ensure consistency between physically modelled reticle heating behaviour (deformation modes for example) and measured reticle heating behaviour.

Regarding the ML model, part of the machine learning based modelling is the defining of a feature space providing input for a NN based generator/autoencoder algorithm. The NN based algorithm is trained to a (limited) set of historic feature and reticle heating parameter data, the reticle heating parameter being for example a plurality of deformation modes, one or more time constants associated with the reticle heating process or any other parameter characterizing the heating induced reticle deformation. The physical model and ML model are both generating reticle heating parameter data. Both physical model based and ML based parameter data are compared to RA or any other metrology data indicative of reticle heating induced reticle deformation (wafer alignment, wafer overlay, reticle alignment data).

The comparison is typically performed by a discriminator model, which determines whether the physical model based parameter prediction or the ML based prediction is more consistent with the metrology data based reticle deformation data. The discriminator model may be a neural network or another model trained to predict a reticle heating based reticle deformation (parameter) based on inputting physical model data. The discriminator model may be trained for example using historic RA and physical model based reticle deformation prediction data.

Figure 14:
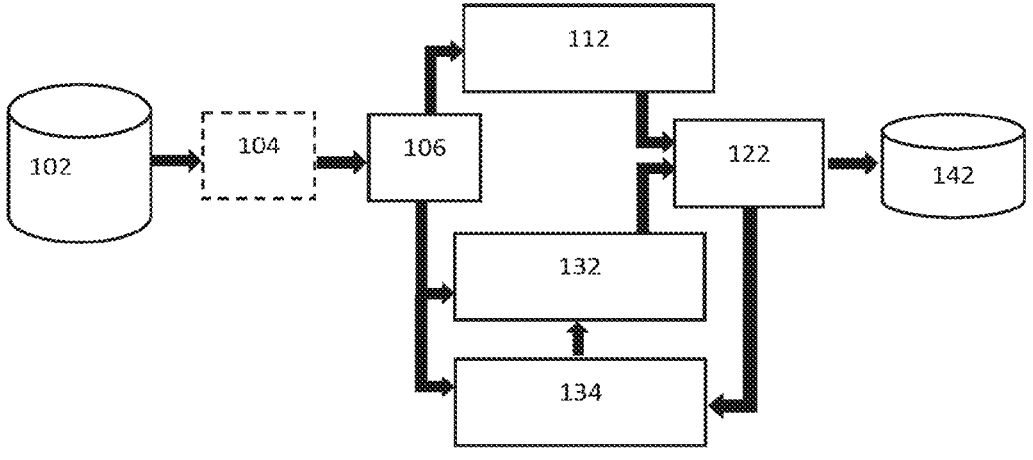
FIG. 14 illustrates a method for training a machine learning model by receiving rewards from a discriminator model comparing outputs of the machine learning model and a physical model.

FIG. 14 graphically depicts an embodiment of the invention. First data 102 is obtained, the data 102 is preferably representative for one or more lots of wafers subject to a reticle heating induced pattern placement variation (wafer to wafer, field to field). Optionally the first data 102 comprises data which is not representative for its purpose and a data selection step 104 is performed to ensure exclusively data associated with a certain relevant reticle heating behaviour is selected. Step 104 could be for example selecting only data from lots of wafers that started with a cold reticle (e.g. the reticle was cooled down to a certain required minimum level before exposure of the lot was initiated). After the optional data preparation step 104 a representative data set is available comprising both measured reticle heating induced reticle deformation data (reticle alignment measurement based for example) and context parameters 106 typically used as input for feedforward prediction of reticle heating behaviour. Examples of context parameters 106 are: time of exposure of a lot, transmission of the reticle of interest, the size of the area on the reticle that is illuminated by the lithographic tool and the intensity of the radiation used during said illumination of the reticle.

The context parameters 106 serve as input to a physical model 112 and as training input to a machine learning model 134. The machine learning model 134 may be a neural network configured as a generator within a Generative Adversarial Network (GAN) or an Encoder-Decoder based framework. The physics model 112 is configured to model the reticle heating induced deformation given the heating characteristics and heating history correspond to the configuration as described by the context parameters 106. The modelling is typically based on Finite Element Modeling (FEM) and delivers one or more modes of deformation describing one or more geometries of in-plane deformation of the reticle due to the heating. More generically the physical model is used to characterize the reticle heating induced deformation by deriving parameters describing the reticle (in-plane) deformation.

The machine learning model 134 uses the context parameters 106 to define a latent space to which the various context parameter values comprised within the data set 102 are projected. Said context parameters 106 are then represented within the latent space and then mapped 132 by a neural network, being for example the decoder network within the Encoder-Decoder framework or the generator, to the one or more parameters characterizing the reticle heating induced reticle deformation. The one or more parameters may for example be the previously described geometrical modes of deformation.

During the training of the model 134 the predicted parameters provided in step 132 are compared by a discriminator model (comparator) 122 to the parameters obtained by the physical model 112. The discriminator model 122 assesses whether the machine learning based parameters or the physical model based parameters most accurately describe the reticle heating behaviour, for example by comparing deformation modes provided by both models to measurement data comprised within the data set 102 (for example deformation data obtained from reticle alignment measurements). The discriminator 122 may be configured to further store the parameters, preferably reticle deformation modes in a library 142 which may be consulted for future use.

The discriminator 122 may further be configured to act as an agent configured to reward the machine learning model 134 in case the prediction 132 compares favourably to the physical model 112 based prediction. It is expected that initially the physics model 112 based predictions are more accurate, but after sufficient training of the model 134 the balance will gradually shift to the machine learning based prediction 132. It is observed that machine learning based predictions often become better in predicting behaviour as they become more generic in time; e.g. are better equipped to fetch behaviour originating from subtle variations in context parameters and other environmental parameters which are often not modelled accurately by physical models.

In an embodiment the data 102 comprises both context parameter data 106 and measured data representing observed heating behaviour. The data 102 and context parameters 106 may be continuously supplied during operation of a semiconductor manufacturing process (such as a lithographic patterning process). During the operation continuous training of the machine learning model 134 is combined with continuous comparison 122 of the machine learning based (132) and physics model based (112) characterization of the heating behaviour (such as reticle, lens or substrate heating). Input for both models is the context parameter data comprised within the data 102. The machine learning model is continuously trained based on the data 102. The machine learning model receives rewards from the agent performing the comparison step 122 in case it provides more accurate predicted heating behaviour than the physics model 112.

It is only when after sufficient training of the model 134 that the machine learning framework 132, 134 outperforms the physical model 112. After said sufficient training new context data 106 may be used directly by the model performing the machine learning based prediction 132 to provide the desired parameters, such as modes of deformation, instead of relying on physics model based heating prediction.

Even after sufficient training of the machine learning model typically it will continue to be trained to newly provided heating related data, context data and if needed data generated by the physical model, so typically the proposed machine learning implementation is a continuously trained implementation.

In addition to heating behaviour also other drift related phenomena, such as mechanical drift, wear effects, slow oscillations or any other effect causing a time dependent behaviour of a performance parameter may be modelled according to the modelling framework as described above.

In an embodiment a non-transitory computer readable medium having instructions thereon is provided, the instructions when executed by a computer causing the computer to: receive measured parameter data associated with a time dependent behaviour of a process and context data associated with the state of the process during the time dependent behaviour; determine first values of one or more parameters characterizing the time dependent behaviour based on inputting the context data to a physical model of the process; determine second values of the one or more parameters by providing the context data to a machine learning model trained on historic measured parameter data and historic context data; determine whether the first or the second values of the one or more parameters correspond better to the measured parameter data; and train the machine learning model using the measured parameter data and context data in case the second values of the one or more parameters correspond better to the measured parameter data than the first values of the one or more parameters.

In an embodiment the instructions for determining whether the first or second values of the one or parameters correspond better to the measured parameter data are configured to act like an agent for the machine learning model, the agent rewarding the machine learning model in case the second values of the one or more parameters correspond better to the measured parameter data than the first values of the one or more parameters.

In an embodiment the instructions for determining whether the first or second values of the one or parameters correspond better to the measured parameter data are implemented as a further machine learning model.

In an embodiment the further machine learning model is configured to be an agent for said machine learning model and the agent is configured to: i) use said first and second values and the measured parameter data as an input and ii) provide a reward to the machine learning model in case the second values of the one or more parameters correspond better to the measured parameter data than the first values of the one or more parameters.

In an embodiment the machine learning model and further machine learning model are based on a neural network architecture.

In an embodiment the machine learning model is configured as a generative branch and the further machine learning model is configured as a discriminative branch of a Generative Adversarial Network (GAN).

In an embodiment the machine learning model comprises one of: a Convolutional Neural Network (CNN) or an Encoder-Decoder based model.

In an embodiment the Encoder-Decoder model comprises an encoder configured to map the context data to a latent space and a decoder configured to reconstruct the one or more parameters based on the mapped context data.

In an embodiment the measured parameter data and time dependent behaviour are associated with a heating induced behaviour within an etching apparatus or a lithographic apparatus and the context data is associated with the state and/or settings of the lithographic or etching apparatus.

In an embodiment the heating induced behaviour is associated with the heating of a patterning device illuminated by the lithographic apparatus and the one or more parameters characterize a geometrical deformation of the patterning device caused by said heating of the pattern device in case the state and/or settings of the lithographic apparatus correspond to the context data.

In an embodiment the one or more parameters comprise one or more modes of deformation associated with the geometrical deformation and the context data.

In an embodiment the context data comprises one or more of: processing history of substrates subject to the process, size of an area on the patterning device illuminated by the lithographic apparatus, intensity or dose received by the area on the patterning device during processing of one or more substrates, transmission of the patterning device.

In an embodiment the measured parameter data comprises position data associated with a plurality of features provided to the patterning device.

In an embodiment the first values of the one or more parameters are at least partially based on the historic measured parameter data.

In an embodiment further instructions are provided for storing the first or second values of the one or more parameters in a database structure depending on whether the first or the second values of the one or more parameters correspond better to the measured parameter data.

In an embodiment further instructions are provided for configuring an apparatus used in performing the process based on either the first or second values of the one or more parameters.

In an embodiment the apparatus is a lithographic apparatus and the process is a semiconductor manufacturing process.

In an embodiment the instructions for receiving the measured parameter data further comprise instructions to filter the received measured parameter data based on a requirement on its corresponding context data and wherein the machine learning model is trained using the filtered measured parameter data.

The machine learning framework as described above may comprise a machine learning model and a further machine learning model acting as an agent when training said machine learning model. During the training phase the machine learning framework may receive training control outputs corresponding to a plurality of training control inputs associated with a plurality of operational conditions. The operational conditions may be comprised within context data such as field size, intensity, reticle transmission, said operational conditions typically serving as an input to a lithographic apparatus to control the lithographic process. The training control outputs may be based on physical modelling of the process, for example one or more modelled deformation modes of a reticle when heating up. The machine learning framework generates (using the training control inputs) a plurality of machine learning generated control outputs which are compared (using for example the further machine learning model) to the received training control outputs generated by a physical model. The comparing of the machine learning generated control outputs to the physical model based control outputs is an important aspect of the invention as this allows improved training of the machine learning model.

In an embodiment a non-transitory computer readable medium having instructions thereon is provided, the instructions when executed by a computer causing the computer to: receive a control input, the control input for controlling a patterning process, the control input comprising one or more parameters used in the patterning process; and generate, with a trained machine learning model, based on the control input, a control output for the patterning process, the machine learning model having been trained with training data generated from actual process data, wherein the training data comprises 1) a plurality of training control inputs corresponding to a plurality of operational conditions of the patterning process, the plurality of operational conditions of the patterning process associated with operational condition specific behavior of the patterning process over time, and 2) training control outputs generated using a physical model based on the training control inputs and/or the plurality of operational conditions of the patterning process.

In an embodiment the training control inputs comprise the operational conditions.

In an embodiment the training control inputs are one or more of: a transmission of a reticle used in the patterning process, a field size of a lithographic apparatus used in illuminating the reticle, an intensity of radiation used in illuminating the reticle.

In an embodiment the training control outputs are values of one or more parameters characterizing the time dependent behaviour of the patterning process.

In an embodiment the one or more parameters characterize a geometrical deformation of the reticle caused by heating of the reticle in case the state and/or settings of the lithographic apparatus correspond to the operational conditions.

Further embodiments are disclosed in the list of numbered clauses below:

1. A non-transitory computer readable medium having instructions thereon, the instructions when executed by a computer causing the computer to:

receive a control input, the control input for controlling a patterning process, the control input comprising one or more parameters used in the patterning process; and generate, with a trained machine learning model, based on the control input, a control output for the patterning process, the machine learning model having been trained with training data generated from simulation of the patterning process and/or actual process data, wherein the training data comprises 1) a plurality of training control inputs corresponding to a plurality of operational conditions of the patterning process, the plurality of operational conditions of the patterning process associated with operational condition specific behavior of the patterning process over time, and 2) training control outputs generated using a physical model based on the training control inputs.

2. The medium of clause 1, wherein the operational condition specific behavior of the patterning process over time comprises drift in the patterning process over time.

3. The medium of clause 1 or 2, wherein the machine learning model is further configured to be updated over time by re-training the machine learning model with new actual process data from the patterning process.

4. The medium of clause 3, wherein the re-training comprises fine tuning.

5. The medium of any of clauses 1-4, wherein the control input is associated with monitoring and/or diagnosing the patterning process.

6. The medium of any of clauses 1-5, wherein the machine learning model comprises a parameterized model.

7. The medium of any of clauses 1-6, wherein the machine learning model comprises an artificial neural network, a convolutional neural network, and/or a recurrent neural network.

8. The medium of any of clauses 1-7, wherein the patterning process is performed with a patterning process apparatus, the apparatus comprising a semiconductor lithography apparatus, an optical metrology inspection tool, or an e-beam inspection tool, the instructions further causing the computer to control the patterning process apparatus based at least in part on the control output.

9. The medium of any of clauses 1-8, wherein the one or more parameters comprise one or more lithography apparatus, optical metrology inspection tool, and/or e-beam inspection tool parameters, and/or associated lithography and/or inspection process parameters.

10. The medium of any of clauses 1-9, wherein the control input comprises the one or more parameters used in the patterning process.

11. The medium of any of clauses 1-10, wherein the control input comprises a diffraction pattern image, a motion setpoint, or a load sequence for a wafer and/or a reticle.

12. The medium of any of clauses 1-11, wherein the control output comprises an adjustment of one or more parameters associated with motion control of one or more components of a patterning process apparatus.

13. The medium of clause 12, wherein motion control of one or more components of the patterning process apparatus comprises controlling actuation of a scanner via one or both of 1) controlling movement of a wafer and/or reticle stage of the scanner, 2) controlling flex-wave heating elements in a lens of the scanner, and/or 3) controlling one or more mirrors of the scanner, such as movable mirrors used in pupil shaping and/or field distortion control.

14. The medium of any of clauses 1-13, wherein the control output comprises an adjustment of one or more parameters associated with thermal expansion of one or more components of a patterning process apparatus.

15. The medium of clause 14, wherein the control output comprises a wafer heating control 16. The medium of clause 15, wherein determining the control output comprises predicting an overlay fingerprint and/or a focus fingerprint, and determining the wafer heating control adjustment based on the predicted overlay fingerprint and/or focus fingerprint.

17. The medium of clause 16, wherein determining the control output comprises predicting the overlay fingerprint, and determining the wafer heating control adjustment is based on the predicted overlay fingerprint.

18. The medium of clause 14, wherein the control output comprises a lens heating control adjustment.

19. The medium of clause 18, wherein determining the control output comprises:

predicting mu tau parameter values associated with lens heating, a lens heating feedforward time sequence, and/or a lens heating field time sequence;

determining a lens heating cost function based on the mu tau values, lens heating feedforward values, and/or lens heating field values;

determining machine learning model parameter weights based on the lens heating cost function; and determining the lens heating control adjustment based on a lens heating prediction by the machine learning model.

20. The medium of clause 18, wherein determining the control output comprises predicting an overlay fingerprint, a focus fingerprint, and/or an imaging fingerprint, and determining the lens heating control adjustment based on the predicted overlay fingerprint, focus fingerprint, and/or imaging fingerprint.

21. The medium of any of clauses 1-20, wherein the control output comprises an adjustment of one or more parameters associated with tribological-mechanical control of one or more components of a patterning process apparatus.

22. The medium of clause 21, wherein determining the control output comprises predicting an overlay fingerprint and/or a focus fingerprint, and determining wafer, reticle, lens/mirror adjustments based on the predicted overlay fingerprint and/or focus fingerprint.

23. The medium of any of clauses 1-22, wherein training the machine learning model with simulated and/or actual process training data from the patterning process comprises an initial calibration, wherein the machine learning model is configured to be updated over time by re-training the machine learning model with new actual process data from the patterning process, and wherein the re-training comprises configuring the machine learning model to be fine-tuned with one or more drift calibrations configured to account for drift that occurs in the patterning process over time.

24. The medium of any of clauses 1-23, wherein training and/or updating is performed off-line, online, or off-line and online in combination.

25. The medium of any of clauses 1-24, wherein:

simulated training data comprises a plurality of training control input and corresponding training control output pairs generated using the physical model;

the machine learning model is configured to predict, based on a training control input, a predicted control output; and the machine learning model is configured to use a training control output as feedback to update one or more configurations of the machine learning model, wherein the one or more configurations are updated based on a comparison between the training control output and the predicted control output.

26. The medium of any of clauses 1-25, wherein the instructions are further configured to cause the computer to configure the machine learning model to be updated over time by fine-tuning the machine learning model with new actual process data from the patterning process, such that the machine learning model is configured for:

receiving local actual process data associated with a production environment local patterning process with the machine learning model to determine first updated model parameter values;

receiving second updated model parameter values obtained by providing the machine learning model at least partially with external training data, the external training data indicative of patterning process apparatus to apparatus variation; and adjusting the machine learning model by updating initial model parameter values with the first and/or second updated model parameter values.

27. The medium of clause 26, wherein the adjusting accounts for drift in the local patterning process over time.

28. A method for generating a control output for a patterning process, the method comprising:

receiving a control input, the control input for controlling a patterning process, the control input comprising one or more parameters used in the patterning process; and generating, with a trained machine learning model, based on the control input, a control output for the patterning process, the machine learning model having been trained with training data generated from simulation of the patterning process and/or actual process data, wherein the training data comprises 1) a plurality of training control inputs corresponding to a plurality of operational conditions of the patterning process, the plurality of operational conditions of the patterning process associated with operational condition specific behavior of the patterning process over time, and 2) training control outputs generated using a physical model based on the training control inputs.

29. The method of clause 28, wherein the operational condition specific behavior of the patterning process over time comprises drift in the patterning process over time.

30. The method of clause 28 or 29, further comprising updating the machine learning model over time by re-training the machine learning model with new actual process data from the patterning process.

31. The method of clause 30, wherein the re-training comprises fine tuning.

32. The method of any of clauses 28-31, wherein the control input is associated with monitoring and/or diagnosing the patterning process.

33. The method of any of clauses 28-32, wherein the machine learning model comprises a parameterized model.

34. The method of any of clauses 28-33, wherein the machine learning model comprises an artificial neural network, a convolutional neural network, and/or a recurrent neural network.

35. The method of any of clauses 28-34, wherein the patterning process is performed with a patterning process apparatus, the apparatus comprising a semiconductor lithography apparatus, an optical metrology inspection tool, or an e-beam inspection tool, the method further comprising controlling the patterning process apparatus based at least in part on the control output.

36. The method of any of clauses 28-35, wherein the one or more parameters comprise one or more lithography apparatus, optical metrology inspection tool, and/or e-beam inspection tool parameters, and/or associated lithography and/or inspection process parameters.

37. The method of any of clauses 28-36, wherein the control input comprises the one or more parameters used in the patterning process.

38. The method of any of clauses 28-37, wherein the control input comprises a diffraction pattern image, a motion setpoint, or a load sequence for a wafer and/or a reticle.

39. The method of any of clauses 28-38, wherein the control output comprises an adjustment of one or more parameters associated with motion control of one or more components of a patterning process apparatus.

40. The method of clause 39, wherein motion control of one or more components of the patterning process apparatus comprises controlling actuation of a scanner via one or both of 1) controlling movement of a wafer and/or reticle stage of the scanner, 2) controlling flex-wave heating elements in a lens of the scanner, and/or 3) controlling one or more mirrors of the scanner.

41. The method of any of clauses 28-40, wherein the control output comprises an adjustment of one or more parameters associated with thermal expansion of one or more components of a patterning process apparatus.

42. The method of clause 41, wherein the control output comprises a wafer heating control 43. The method of clause 42, wherein determining the control output comprises predicting an overlay fingerprint and/or a focus fingerprint, and determining the wafer heating control adjustment based on the predicted overlay fingerprint and/or focus fingerprint.

44. The method of clause 43, wherein determining the control output comprises predicting the overlay fingerprint, and determining the wafer heating control adjustment is based on the predicted overlay fingerprint.

45. The method of clause 41, wherein the control output comprises a lens heating control adjustment.

46. The method of clause 45, wherein determining the control output comprises:

predicting mu tau parameter values associated with lens heating, a lens heating feedforward time sequence, and/or a lens heating field time sequence;

determining a lens heating cost function based on the mu tau values, lens heating feedforward values, and/or lens heating field values;

determining machine learning model parameter weights based on the lens heating cost function; and determining the lens heating control adjustment based on a lens heating prediction by the machine learning model.

47. The method of clause 45, wherein determining the control output comprises predicting an overlay fingerprint, a focus fingerprint, and/or an imaging fingerprint, and determining the lens heating control adjustment based on the predicted overlay fingerprint, focus fingerprint, and/or imaging fingerprint.

48. The method of any of clauses 28-47, wherein the control output comprises an adjustment of one or more parameters associated with tribological-mechanical control of one or more components of a patterning process apparatus.

49. The method of clause 48, wherein determining the control output comprises predicting an overlay fingerprint and/or a focus fingerprint, and determining wafer, reticle, lens/mirror adjustments based on the predicted overlay fingerprint and/or focus fingerprint.

50. The method of any of clauses 28-49, wherein training the machine learning model with simulated and/or actual process training data from the patterning process comprises an initial calibration, wherein the machine learning model is configured to be updated over time by re-training the machine learning model with new actual process data from the patterning process, and wherein the re-training comprises configuring the machine learning model to be fine-tuned with one or more drift calibrations configured to account for drift that occurs in the patterning process over time.

51. The method of any of clauses 28-50, wherein training and/or updating is performed off-line, online, or off-line and online in combination.

52. The method of any of clauses 28-51, wherein:

simulated training data comprises a plurality of training control input and corresponding training control output pairs generated using the physical model;

the machine learning model is configured to predict, based on a training control input, a predicted control output; and the machine learning model is configured to use a training control output as feedback to update one or more configurations of the machine learning model, wherein the one or more configurations are updated based on a comparison between the training control output and the predicted control output.

53. The method of any of clauses 28-52, further comprising configuring the machine learning model to be updated over time by fine-tuning the machine learning model with new actual process data from the patterning process, such that the machine learning model is configured for:

receiving local actual process data associated with a production environment local patterning process with the machine learning model to determine first updated model parameter values;

receiving second updated model parameter values obtained by providing the machine learning model at least partially with external training data, the external training data indicative of patterning process apparatus to apparatus variation; and adjusting the machine learning model by updating initial model parameter values with the first and/or second updated model parameter values.

54. The method of clause 53, wherein the adjusting accounts for drift in the local patterning process over time.

55. A method for training a machine learning model, the method comprising:

generating training data by simulating a patterning process, the training data comprising a plurality of training control inputs and corresponding training control outputs, the training control inputs comprising one or more parameters used in the patterning process and the training control outputs comprising adjustments of the one or more parameters;

providing the training control inputs to a base machine learning model to generate predicted control outputs; and using the training control outputs as feedback to update one or more configurations of the base machine learning model, wherein the one or more configurations are updated based on a comparison between the training control outputs and the predicted control outputs, such that:

the machine learning model is configured to generate new control outputs based on new control inputs.

56. The method of clause 55, wherein the machine learning model is configured to be updated over time by re-training the machine learning model with actual and/or simulated process data from the patterning process.

57. The method of clause 55, wherein the patterning process is simulated with a physical model.

58. The method of any of clauses 55-57, wherein the machine learning model is an artificial neural network.

59. A non-transitory computer readable medium having instructions thereon, the instructions when executed by a computer causing the computer to:

receive a plurality of control inputs for controlling a patterning process for a plurality of corresponding operational conditions, each of the control inputs comprising one or more parameters used in the patterning process;

generate or receive a plurality of control outputs associated with one or more adjustments of the one or more parameters, the plurality of control outputs based on the output of a physical model used in simulating behavior of the patterning process subject to the plurality of operational conditions; and train a machine learning model configured to infer a new control output corresponding to a new control input by inputting the received plurality of control inputs and plurality of generated or received control outputs.

60. The transitory computer readable medium or method of any of clauses 1 to 54, wherein the control output comprises an adjustment of the one or more parameters.

61. A non-transitory computer readable medium having instructions thereon, the instructions when executed by a computer causing the computer to: receive measured parameter data associated with a time dependent behaviour of a process and context data associated with the state of the process during the time dependent behaviour; determine first values of one or more parameters characterizing the time dependent behaviour based on inputting the context data to a physical model of the process; determine second values of the one or more parameters by providing the context data to a machine learning model trained on historic measured parameter data and historic context data; determine whether the first or the second values of the one or more parameters correspond better to the measured parameter data; and train the machine learning model using the measured parameter data and context data in case the second values of the one or more parameters correspond better to the measured parameter data than the first values of the one or more parameters.

62. The computer readable medium of clause 61, wherein the instructions for determining whether the first or second values of the one or parameters correspond better to the measured parameter data are configured to act like an agent for the machine learning model, the agent rewarding the machine learning model in case the second values of the one or more parameters correspond better to the measured parameter data than the first values of the one or more parameters.

63. The computer readable medium of clause 61 or 62, wherein the instructions for determining whether the first or second values of the one or parameters correspond better to the measured parameter data are implemented as a further machine learning model.

64. The computer readable medium of clause 63, wherein the further machine learning model is configured to be an agent for said machine learning model and the agent is configured to: i) use said first and second values and the measured parameter data as an input and ii) provide a reward to the machine learning model in case the second values of the one or more parameters correspond better to the measured parameter data than the first values of the one or more parameters.

65. The computer readable medium of clause 63 or 64, wherein the machine learning model and further machine learning model are based on a neural network architecture.

66. The computer readable medium of clause 65, wherein the machine learning model is configured as a generative branch and the further machine learning model is configured as a discriminative branch of a Generative Adversarial Network (GAN).

67. The computer readable medium of any of clauses 61 to 66, wherein the machine learning model comprises one of: a Convolutional Neural Network (CNN) or an Encoder-Decoder based model.

68. The computer readable medium of clause 67, wherein the Encoder-Decoder model comprises an encoder configured to map the context data to a latent space and a decoder configured to reconstruct the one or more parameters based on the mapped context data.

69. The computer readable medium of any of clauses 61 to 68, wherein the measured parameter data and time dependent behaviour are associated with a heating induced behaviour within an etching apparatus or a lithographic apparatus and the context data is associated with the state and/or settings of the lithographic or etching apparatus.

70. The computer readable medium of clause 69, wherein the heating induced behaviour is associated with the heating of a patterning device illuminated by the lithographic apparatus and the one or more parameters characterize a geometrical deformation of the patterning device caused by said heating of the pattern device in case the state and/or settings of the lithographic apparatus correspond to the context data.

71. The computer readable medium of clause 70, wherein the one or more parameters comprise one or more modes of deformation associated with the geometrical deformation and the context data.

72. The computer readable medium of clause 70 or 71, wherein the context data comprises one or more of: processing history of substrates subject to the process, size of an area on the patterning device illuminated by the lithographic apparatus, intensity or dose received by the area on the patterning device during processing of one or more substrates, transmission of the patterning device.

73. The computer readable medium of clause 72, wherein the measured parameter data comprises position data associated with a plurality of features provided to the patterning device.

74. The computer readable medium of any of clauses 61 to 73, wherein the first values of the one or more parameters are at least partially based on the historic measured parameter data.

75. The computer readable medium of any of clauses 61 to 74, further comprising instructions for storing the first or second values of the one or more parameters in a database structure depending on whether the first or the second values of the one or more parameters correspond better to the measured parameter data.

76. The computer readable medium of any of clauses 61 to 75, further comprising instructions for configuring an apparatus used in performing the process based on either the first or second values of the one or more parameters.

77. The computer readable medium of clause 76, wherein the apparatus is a lithographic apparatus and the process is a semiconductor manufacturing process.

78. The computer readable medium of any of clauses 61 to 77, wherein the instructions for receiving the measured parameter data further comprise instructions to filter the received measured parameter data based on a requirement on its corresponding context data and wherein the machine learning model is trained using the filtered measured parameter data.

79. The computer readable medium of any of clauses 61 to 78, further comprising instructions to use the first and/or second values of the one or more parameters as a control input for a lithographic apparatus.

80. The computer readable medium of any of clauses 61 to 79, further comprising instructions to use the first and/or second values of the one or more parameters to predict a control output of a lithographic apparatus.

81. A method, the method comprising: receiving measured parameter data associated with a time dependent behaviour of a process and context data associated with the state of the process during the time dependent behaviour; determining first values of one or more parameters characterizing the time dependent behaviour based on inputting the context data to a physical model of the process; determining second values of the one or more parameters by providing the context data to a machine learning model trained on historic measured parameter data and historic context data; determining whether the first or the second values of the one or more parameters correspond better to the measured parameter data; and training the machine learning model using the measured parameter data and context data in case the second values of the one or more parameters correspond better to the measured parameter data than the first values of the one or more parameters.

82. The method of clause 81, wherein the instructions for determining whether the first or second values of the one or parameters correspond better to the measured parameter data are configured to act like an agent for the machine learning model, the agent rewarding the machine learning model in case the second values of the one or more parameters correspond better to the measured parameter data than the first values of the one or more parameters.

83. The method of clause 81 or 82, wherein the determining whether the first or second values of the one or parameters correspond better to the measured parameter data uses a further machine learning model.

84. The method of clause 83, wherein the further machine learning model is configured to be an agent for said machine learning model and the agent is configured to: i) use said first and second values and the measured parameter data as an input and ii) provide a reward to the machine learning model in case the second values of the one or more parameters correspond better to the measured parameter data than the first values of the one or more parameters.

85. The method of clause 83 or 84, wherein the machine learning model and further machine learning model are based on a neural network architecture.

86. The method of clause 85, wherein the machine learning model is configured as a generative branch and the further machine learning model is configured as a discriminative branch of a Generative Adversarial Network (GAN).

87. The method of any of clauses 81 to 86, wherein the machine learning model comprises one of: a Convolutional Neural Network (CNN) or an Encoder-Decoder based model.

88. The method of clause 87, wherein the Encoder-Decoder model comprises an encoder configured to map the context data to a latent space and a decoder configured to reconstruct the one or more parameters based on the mapped context data.

89. The method of any of clauses 81 to 88, wherein the measured parameter data and time dependent behaviour are associated with a heating induced behaviour within an etching apparatus or a lithographic apparatus and the context data is associated with the state and/or settings of the lithographic or etching apparatus.

90. The method of clause 89, wherein the heating induced behaviour is associated with the heating of a patterning device illuminated by the lithographic apparatus and the one or more parameters characterize a geometrical deformation of the patterning device caused by said heating of the pattern device in case the state and/or settings of the lithographic apparatus correspond to the context data.

91. The method of clause 90, wherein the one or more parameters comprise one or more modes of deformation associated with the geometrical deformation and the context data.

92. The method of clause 90 or 91, wherein the context data comprises one or more of: processing history of substrates subject to the process, size of an area on the patterning device illuminated by the lithographic apparatus, intensity or dose received by the area on the patterning device during processing of one or more substrates, transmission of the patterning device.

93. The method of clause 92, wherein the measured parameter data comprises position data associated with a plurality of features provided to the patterning device.

94. The method of any of clauses 81 to 93, wherein the first values of the one or more parameters are at least partially based on the historic measured parameter data.

95. The method of any of clauses 81 to 94, further comprising: storing the first or second values of the one or more parameters in a database structure depending on whether the first or the second values of the one or more parameters correspond better to the measured parameter data.

96. The method of any of clauses 81 to 95, further comprising: configuring an apparatus used in performing the process based on either the first or second values of the one or more parameters.

97. The method of clause 96, wherein the apparatus is a lithographic apparatus and the process is a semiconductor manufacturing process.

98. The method of any of clauses 81 to 97, wherein the receiving the measured parameter data further comprises filtering of the received measured parameter data based on a requirement on its corresponding context data and wherein the machine learning model is trained using the filtered measured parameter data.

100. The transitory computer readable medium or method of any of clauses 1 to 54, wherein the training control inputs comprise the operational conditions.

101. The transitory computer readable medium or method of clause 100, wherein the training control inputs are one or more of: a transmission of a reticle used in the patterning process, a field size of a lithographic apparatus used in illuminating the reticle, an intensity of radiation used in illuminating the reticle.

102. The transitory computer readable medium or method of clause 100 or 101, wherein the training control outputs are values of one or more parameters characterizing the time dependent behaviour of the patterning process.

103. The transitory computer readable medium or method of clause 102, wherein the one or more parameters characterize a geometrical deformation of the reticle caused by heating of the reticle in case the state and/or settings of the lithographic apparatus correspond to the operational conditions.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. As described herein, a machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A non-transitory computer readable medium having instructions thereon or therein, the instructions, when executed by a computer system, configured to cause the computer system to at least:

receive a control input, the control input for controlling a patterning process, the control input comprising one or more parameters used in the patterning process;

generate, with a trained machine learning model, based on the control input, a control output for the patterning process, the machine learning model having been trained with training data generated from simulation of the patterning process and/or actual process data, wherein the training data comprises 1) a plurality of training control inputs corresponding to a plurality of operational conditions of the patterning process, the plurality of operational conditions of the patterning process associated with operational condition specific behavior of the patterning process over time, and 2) a plurality of training control outputs corresponding to the plurality of training control inputs, wherein each training control output is generated using a physical model having a corresponding training control input as an input; and configure a physical measurement or manufacturing step of the patterning process based on the control output, or provide a signal representing, or based on, the control output to a system for use in configuration of a physical measurement or manufacturing step of the patterning process.

2. The non-transitory computer readable medium of claim 1, wherein the operational condition specific behavior of the patterning process over time comprises drift in the patterning process over time.

3. The non-transitory computer readable medium of claim 1, wherein the machine learning model comprises an artificial neural network, a convolutional neural network, and/or a recurrent neural network.

4. The non-transitory computer readable medium of claim 1, wherein the one or more parameters comprise one or more selected from: a lithographic apparatus, optical metrology inspection tool, and/or e-beam inspection tool parameter, and/or associated lithography and/or inspection process parameter.

5. The non-transitory computer readable medium of claim 1, wherein the control input comprises a diffraction pattern image, a motion setpoint, or a load sequence for a wafer and/or a reticle.

6. The non-transitory computer readable medium of claim 1, wherein the control output comprises an adjustment of one or more parameters associated with motion control of one or more components of a patterning process apparatus.

7. The non-transitory computer readable medium of claim 6, wherein motion control of one or more components of the patterning process apparatus comprises controlling actuation of a lithographic apparatus via 1) controlling movement of a wafer and/or reticle stage of the lithographic apparatus, 2) controlling flex-wave heating elements in a lens of the lithographic apparatus, and/or 3) controlling one or more mirrors of the lithographic apparatus.

8. The non-transitory computer readable medium of claim 1, wherein the control output comprises an adjustment of one or more parameters associated with thermal expansion of one or more components of a patterning process apparatus.

9. The non-transitory computer readable medium of claim 8, wherein the control output comprises a wafer heating control adjustment, a reticle heating control adjustment, and/or a mirror heating control adjustment.

10. The non-transitory computer readable medium of claim 9, wherein generating the control output comprises predicting an overlay fingerprint and/or a focus fingerprint, and determining the heating control adjustment based on the predicted overlay fingerprint and/or focus fingerprint.

11. The non-transitory computer readable medium of claim 9, wherein the control output comprises a lens heating control adjustment, wherein generating the control output comprises:

predicting mu tau parameter values associated with lens heating, a lens heating feedforward time sequence, and/or a lens heating field time sequence;

determining a lens heating cost function based on the mu tau values, lens heating feedforward values, and/or lens heating field values;

determining machine learning model parameter weights based on the lens heating cost function; and determining the lens heating control adjustment based on a lens heating prediction by the machine learning model.

12. The non-transitory computer readable medium of claim 1, wherein training the machine learning model with simulated and/or actual process training data from the patterning process comprises an initial calibration, wherein the machine learning model is configured to be updated over time by re-training the machine learning model with new actual process data from the patterning process, and wherein the re-training comprises configuring the machine learning model to be fine-tuned with one or more drift calibrations configured to account for drift that occurs in the patterning process over time.

13. The non-transitory computer readable medium of claim 1, wherein:

the training data comprises a plurality of training control input and corresponding training control output pairs generated using the physical model;

the machine learning model is configured to predict, based on a training control input, a predicted control output; and the machine learning model is configured to use a training control output as feedback to update one or more configurations of the machine learning model, wherein the one or more configurations are updated based on a comparison between the training control output and the predicted control output.

14. The non-transitory computer readable medium of claim 1, wherein the training control inputs comprise the operational conditions.

15. The non-transitory computer readable medium of claim 14, wherein the training control inputs are one or more selected from: a transmission of a reticle used in the patterning process, a field size of a lithographic apparatus used in illuminating the reticle, and/or an intensity of radiation used in illuminating the reticle.

16. The non-transitory computer readable medium of claim 14, wherein the training control outputs are values of one or more parameters characterizing time dependent behaviour of the patterning process.

17. The non-transitory computer readable medium of claim 16, wherein the one or more parameters characterize a geometrical deformation of the reticle caused by heating of the reticle in case the state and/or settings of the lithographic apparatus correspond to the operational conditions.

18. A method for generating a control output for a patterning process, the method comprising:

receiving a control input, the control input for controlling a patterning process, the control input comprising one or more parameters used in the patterning process; and generating, with a trained machine learning model, based on the control input, a control output for the patterning process, the machine learning model having been trained with training data generated from simulation of the patterning process and/or actual process data, wherein the training data comprises 1) a plurality of training control inputs corresponding to a plurality of operational conditions of the patterning process, the plurality of operational conditions of the patterning process associated with operational condition specific behavior of the patterning process over time, and 2) a plurality of training control outputs corresponding to the plurality of training control inputs, wherein each training control output is generated using a physical model having a corresponding training control input as an input; and configuring a physical measurement or manufacturing step of the patterning process based on the control output, or providing a signal representing, or based on, the control output to a system for use in configuration of a physical measurement or manufacturing step of the patterning process.

19. The method of claim 18, wherein the training control inputs comprise the operational conditions and are one or more selected from: a transmission of a reticle used in the patterning process, a field size of a lithographic apparatus used in illuminating the reticle, and/or an intensity of radiation used in illuminating the reticle, and wherein the training control outputs are values of one or more parameters characterizing the time dependent behaviour of the patterning process.

20. A non-transitory computer readable medium having instructions thereon or therein, the instructions, when executed by a computer system, configured to cause the computer system to at least:

receive a plurality of control inputs for controlling a patterning process for a plurality of corresponding operational conditions, each of the control inputs comprising one or more parameters used in the patterning process;

generate or receive a plurality of control outputs associated with one or more adjustments of the one or more parameters, the plurality of control outputs based on the output of a physical model used in simulating behavior of the patterning process subject to the plurality of operational conditions;

train a machine learning model configured to infer a new control output corresponding to a new control input by inputting the received plurality of control inputs and plurality of generated or received control outputs; and configure a physical measurement or manufacturing step of the patterning process based on the trained machine learning model, or provide a signal representing, or based on, the trained machine learning model to a system for use in configuration of a physical measurement or manufacturing step of the patterning process.

* * * * *